United States Patent
Ruan et al.

(10) Patent No.: US 11,082,067 B1
(45) Date of Patent: Aug. 3, 2021

(54) SYSTEM AND METHOD FOR DETERMINING BIT TYPES FOR POLAR ENCODING AND DECODING

(71) Applicant: XILINX, INC., San Jose, CA (US)

(72) Inventors: Ming Ruan, San Jose, CA (US); Gordon I. Old, Balerno Midlothian (GB); Richard L. Walke, Edinburgh (GB); Zahid Khan, Scotland (GB)

(73) Assignee: XILINX, INC., San Jose, CA (US)

( * ) Notice: Subject to any disclaimer, the term of this patent is extended or adjusted under 35 U.S.C. 154(b) by 13 days.

(21) Appl. No.: 16/592,381

(22) Filed: Oct. 3, 2019

(51) Int. Cl.
*H03M 13/13* (2006.01)
*G06F 1/03* (2006.01)
*G06F 9/30* (2018.01)
*H03M 13/09* (2006.01)

(52) U.S. Cl.
CPC .............. *H03M 13/13* (2013.01); *G06F 1/03* (2013.01); *G06F 9/30094* (2013.01); *H03M 13/091* (2013.01)

(58) Field of Classification Search
CPC ....... H03M 13/13; H03M 13/091; G06F 1/03; G06F 9/30094
See application file for complete search history.

(56) References Cited

U.S. PATENT DOCUMENTS

| | | | |
|---|---|---|---|
| 2015/0263767 A1* | 9/2015 | Shin ...................... | H03M 13/13 714/796 |
| 2018/0026663 A1* | 1/2018 | Wu ................... | H03M 13/6362 714/776 |
| 2019/0044540 A1* | 2/2019 | Jiang ................. | H03M 13/2796 |
| 2019/0132009 A1* | 5/2019 | Cirkic ............... | H03M 13/3746 |
| 2019/0166611 A1* | 5/2019 | Noh ....................... | H04L 1/0072 |
| 2019/0372599 A1* | 12/2019 | Chen ................. | H03M 13/2906 |
| 2020/0106459 A1* | 4/2020 | Gross ................ | H03M 13/2906 |
| 2020/0195373 A1* | 6/2020 | Chen ..................... | H04L 1/0057 |
| 2020/0252084 A1* | 8/2020 | Chen ..................... | H03M 13/13 |
| 2020/0373945 A1* | 11/2020 | Chaki ................... | H03M 13/13 |

OTHER PUBLICATIONS

3GPP TS 38.212 v15.2.0 (Jul. 2018) 3rd Generation Partnership Project; Technical Specification Group Radio Access Network; NR; Multiplexing and channel coding (Release 15).

* cited by examiner

*Primary Examiner* — Kyle Vallecillo
(74) *Attorney, Agent, or Firm* — Patterson + Sheridan, LLP

(57) ABSTRACT

Embodiments described herein provide a code generation mechanism (FIG. 3, 301) in a Polar encoder (FIG. 2, 204) to determine a bit type (FIG. 3, 312) corresponding to each coded bit in the Polar code before sending the data bits for encoding (FIG. 3, 303). For example, each bit in the Polar code is determined to have a bit type of a frozen bit, parity bit, an information bit, or a cyclic redundancy check (CRC) bit based at least on the respective reliability index of the bit from a pre-computed reliability index lookup table (FIG. 4A, 411). In this way, the bit type determination can be completed in one loop by iterating the list of entries in the pre-computed reliability index lookup table.

20 Claims, 20 Drawing Sheets

1100

1101
Receive a first number of data bits for encoding into a polar code having a second number of data bits, wherin each data bit from the second number of data bits corresponds to a respective position index in the polar code

1102
Determine, by a first loop of iterating entries in a first pre-computed lookup table, whether each data bit corresponding to the respective

1103
Determine by a second loop of iterating saved bit types from intermediate RAM, whether the each data bit corresponding to the respective position index is an information bit, a cyclic redundancy check (CRC) bit or the parity bit.

1104
Generate the polar code based at least on the determined data bits corresponding to the position indice

FIG.11

SYSTEM AND METHOD FOR DETERMINING BIT TYPES FOR POLAR ENCODING AND DECODING

TECHNICAL FIELD

Examples of the present disclosure generally relate to integrated circuits ("ICs") and, in particular, to an embodiment related to ICs including Polar encoders or decoders.

BACKGROUND

Polar codes have been adopted by the $3^{rd}$-generation partnership project (3GPP) for control channel coding in 5G systems. A typical Polar code, e.g., the Polar code described in the Release-15 standard, includes multiple types of data bits, such as information bits, cyclic redundancy check (CRC) bits, parity check bits, frozen bits, and/or the like. The determination of the type of each bit in the Polar code typically involves multiple sequentially connected circuit blocks, each of which is dedicated to CRC attachment, interleaving, puncturing, parity insertion, padding, and sorting, respectively. For each circuit block, each bit position in the Polar code is iterated at least once. The multiple sequentially connected circuit blocks thus require multiple iterations of the bit positions in the Polar code, which results in prolonged latency. Some existing systems precompute data bits for the bit positions in the Polar code and store several precomputed Polar codes such that a Polar encoder or decoder can read the code definition from a memory based upon a match with one of the precomputed codes. However, the precomputed Polar codes usually require a prohibitively large data store to accommodate all the codes required from all subscribers in one transmission time interval in the 5G system, which renders this mechanism impractical.

Accordingly, it would be desirable and useful to provide Polar encoding or decoding with improved latency.

SUMMARY

Other aspects and features will be evident from reading the following detailed description and accompanying drawings.

In view of the prolonged latency issue in existing Polar encoders or decoders, embodiments described herein a circuit for Polar code generation or decoding. The circuit includes a first memory configured to store a first lookup table including a plurality of position indices in a Polar code and a plurality of corresponding reliability indices respectively, and a processor. The processor is configured to retrieve, for each position index in the Polar code, the respective reliability index from the first lookup table, determine a respective bit type from a plurality of predetermined bit types for each data bit of the Polar code corresponding to the respective position index based on the respective reliability index, and generate the Polar code based on the determined bit types.

In some implementations, the processor is configured to determine the respective bit type from a group of a frozen bit type, a parity bit type, an information bit type, or a cyclic redundancy check (CRC) bit type.

In some implementations, the processor is configured to iterate all position indices of the Polar code listed in the first lookup table in a single loop. For each iteration, the processor is configured to determine the respective bit type for each data bit of the Polar code based on a relationship between code parameters including any of the first reliability index, a size of the Polar code, a number of information bits in the Polar code and a number of CRC bits in the Polar code, and a number of parity bits in the Polar code.

In some implementations, the circuit further includes a pre-processor configured to receive code parameters relating to the Polar code, and determine, by iterating entries of the first lookup table in a first loop, one or more reliability index thresholds for determining whether the respective bit type in the Polar code is the frozen bit. The processor is further configured to determine, by iterating entries of a second lookup table in a second loop, the respective bit type for each position index in the Polar code based on the determined one or more reliability index thresholds.

In some implementations, the circuit further includes a second memory configured to store the determined one or more reliability index thresholds, and send the determined one or more reliability index thresholds to the processor.

In some implementations, the second memory is a first-in-first-out (FIFO) memory. The pre-processor includes a threshold adjustment module that is configured to compute threshold adjustment values to a first reliability index threshold for non-frozen bits and to a second reliability index threshold for parity bits, and position indices of pre-defined parity bits. The pre-processor further includes a first FIFO interface that is configured to pass the computed threshold adjustment values and the position indices of pre-defined parity bits to the FIFO memory.

In some implementations, the second memory is a random-access memory configured to indicate whether the bit type corresponding to each position index in the Polar code belongs to (1) the frozen bits or the parity bits, or (2) information bits or cyclic redundancy check (CRC) bits. The pre-processor includes a comparator configured to compare a current count of bits that are not to be punctured after rate matching with a sum of a number of information bits, a number of CRC bits, and a number of parity bits and generate an indication of a bit type of frozen bits, parity bits, or one of CRC bits and information bits. The pre-processor includes a flag encoder configured to generate a bit type flag based on the indication of the bit type, and a first random-access memory interface configured to pass the bit type flag to the ping-pong memory.

In some implementations, the pre-processor includes a set of parallel pre-processing units, and a total number of the parallel pre-processing units is less than or equal to the number of coded bits in the Polar code. Each parallel pre-processing unit is configured to read the respective reliability index from the first lookup table and generate a respective variable based on the reliability index for computing the one or more reliability index thresholds, thereby completing the first loop in one cycle.

In some implementations, the processor includes a set of parallel processing units, wherein a total number of the parallel processing units is no greater than the number of coded bits in the Polar code. Each parallel processing unit is configured to read the respective reliability index from the second lookup table and determine the respective bit type for the respective position index corresponding to the reliability index, thereby completing the second loop in one cycle.

In some implementations, the processor is further configured to determine the respective bit type from the plurality of predetermined bit types for each data bit of the Polar code by: determining, by a first loop of iterating entries in a third lookup table in an order of reliability indices, whether each data bit corresponding to the respective position index is the frozen bit or the parity bit; storing, at an intermediate memory, during the first loop, determined bit types in an order of the bit position indices; and determining, by a second loop of iterating stored determined bit types stored at the intermediate memory in the order of the bit position indices, whether the each data bit corresponding to the respective position index is the information bit, the CRC bit or the parity bit.

Embodiments described herein further provide a method for Polar code generation. The method includes retrieving, for each position index in a Polar code, a respective reliability index from a first lookup table stored at a first memory, the first lookup table including a plurality of position indices in the Polar code and a plurality of corresponding reliability indices respectively, determining a respective bit type from a plurality of predetermined bit types for each data bit of the Polar code corresponding to the respective position index based on the respective reliability index, and generating the Polar code based on the determined bit types.

In some implementations, the method further includes determining the respective bit type from a group of a frozen bit type, a parity bit type, an information bit type, or a cyclic redundancy check (CRC) bit type.

In some implementations, the method further includes iterating all position indices of the Polar code listed in the first lookup table in a single loop. For each iteration, the method determines the respective bit type for each data bit of the Polar code based on a relationship between code parameters including any of the first reliability index, a size of the Polar code, a number of information bits in the Polar code and a number of CRC bits in the Polar code, and a number of parity bits in the Polar code.

In some implementations, the method further includes receiving, at a pre-processor, code parameters relating to the Polar code, and determining, at the pre-processor, by iterating entries of the first lookup table in a first loop, one or more reliability index thresholds for determining whether the respective bit type in the Polar code is the frozen bit, and determining, at a processor, by iterating entries of a second lookup table in a second loop, the respective bit type for the each position index in the Polar code based on the determined one or more reliability index thresholds.

In some implementations, the method further includes storing, at a second memory, the determined one or more reliability index thresholds, and sending the determined one or more reliability index thresholds to the processor.

BRIEF DESCRIPTION OF THE DRAWINGS

FIG. 11 is a logic flow diagram illustrating an alternative process of determining bit types with rate match correction, according to some embodiments described herein.

DETAILED DESCRIPTION

Figure 1:
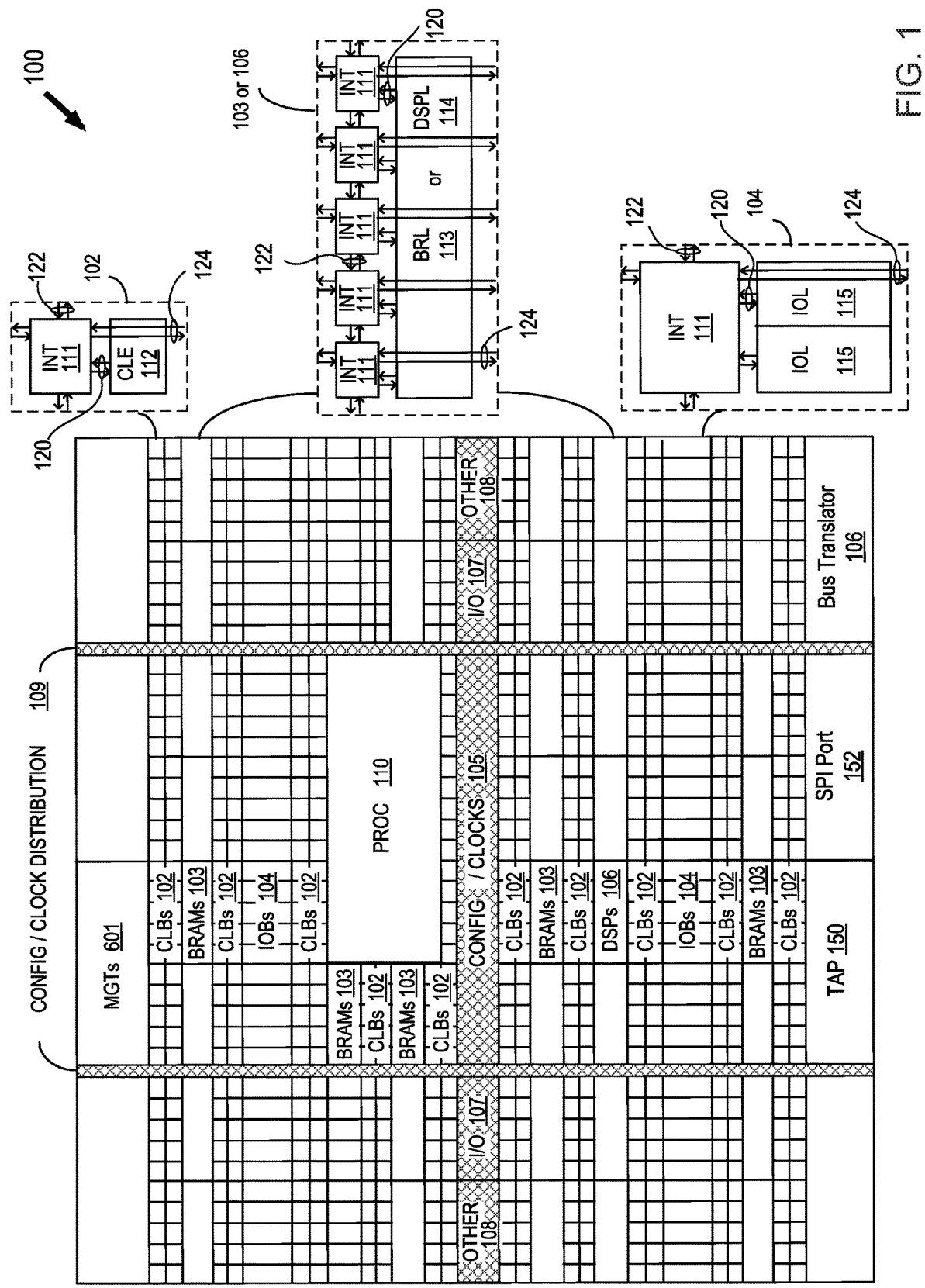
FIG. 1 is a block diagram illustrating an exemplary architecture for an IC on which a transmitter containing a Polar code generator may be implemented, according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

In view of the prolonged latency issues in Polar encoders, embodiments described herein provide a code generator that calculates Polar codes in a natural order, e.g., from bit position index 0 to N−1, where N denotes the total number of bits in the Polar code to be generated. Various advantages may be present in various applications of the present disclosure. No particular advantage is required for all embodiments, and different embodiments may offer different advantages. One advantage of some embodiments is that the code generator iterates all the bit positions in the Polar code only once (e.g., using only a single iteration loop), the code generator results in a lower and more deterministic latency compared to implementations using multiple iterations through all the bit positions (e.g., using multiple iteration loops). Another advantage of some embodiments is that it enables that a Polar encoder can be implemented with code generation during runtime at the hardware level while receiving data bits to be encoded, instead of storing a large library of precomputed Polar code candidates. Yet another advantage of some embodiments is that the hardware implementation of the code generation allows the Polar encoder to handle a higher throughput without the need to be limited by the capacity of software implementation.

With the above general understanding borne in mind, various embodiments for providing the Polar code generators are described below.

Because one or more of the above-described embodiments and embodiments described throughout the application are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Figure 2:
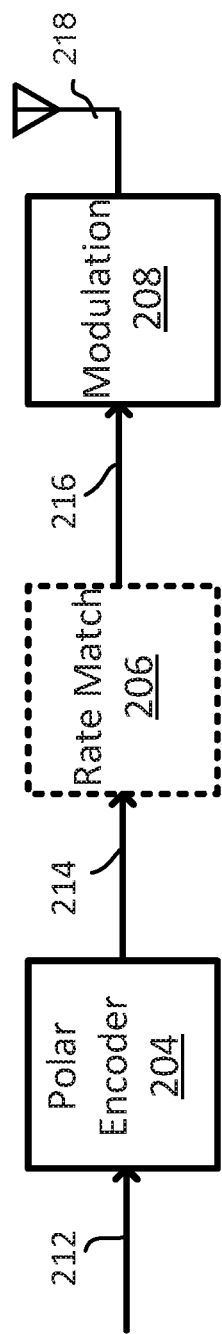
FIG. 2 is a block diagram illustrating an exemplary structure of a 5G transmitter containing a Polar encoder 204 which may be implemented on the IC architecture shown in FIG. 1, according to some embodiments of the present disclosure

FIG. 2 is a block diagram illustrating an exemplary structure of a 5G transmitter 200 containing a Polar encoder 204 which may be implemented on the IC architecture 100 shown in FIG. 1, according to some embodiments of the present disclosure. The transmitter 200 includes a Polar encoder 204, an optional rate matching module 206, and a modulation module 208.

It is noted that various signal modulation and demodulation techniques might be employed by the transmitter 200. The various signals described herein might employ single-bit or multi-bit data symbols based on various data encoding schemes, such as pulse amplitude modulation (e.g., PAM-4). Further, signal amplitudes might be expressed herein as −1 to 1 such as for Non-Return to Zero (NRZ) signaling, although any signal-encoding scheme might be employed.

In some embodiments, the Polar encoder 204 is configured to receive data bits 212 for encoding into Polar codes 214. As further illustrated in FIGS. 3 and 4A-4B, the Polar encoder 204 implements an algorithm to compute Polar codes compatible with 3GPP 38.212, which is suitable for hardware implementation. As further illustrated in FIG. 4A, the hardware implementation of the Polar code generation uses counters, lookup tables and arithmetic or logic comparators. As further illustrated in FIG. 4B, the Polar encoder 204 is configured to determine the type of each bit in the Polar code deterministically in the order of position index from 0 to N−1 in a single iteration through the entire code position indexes 0 to N−1, which is also referred to as a single loop. As the code definition (e.g., bit types) is used by an encoder or decoder in the order of position index, the bits are stored in a packed form (e.g., 32-bits are written per easy random-access memory (RAM) access).

Figure 4A:
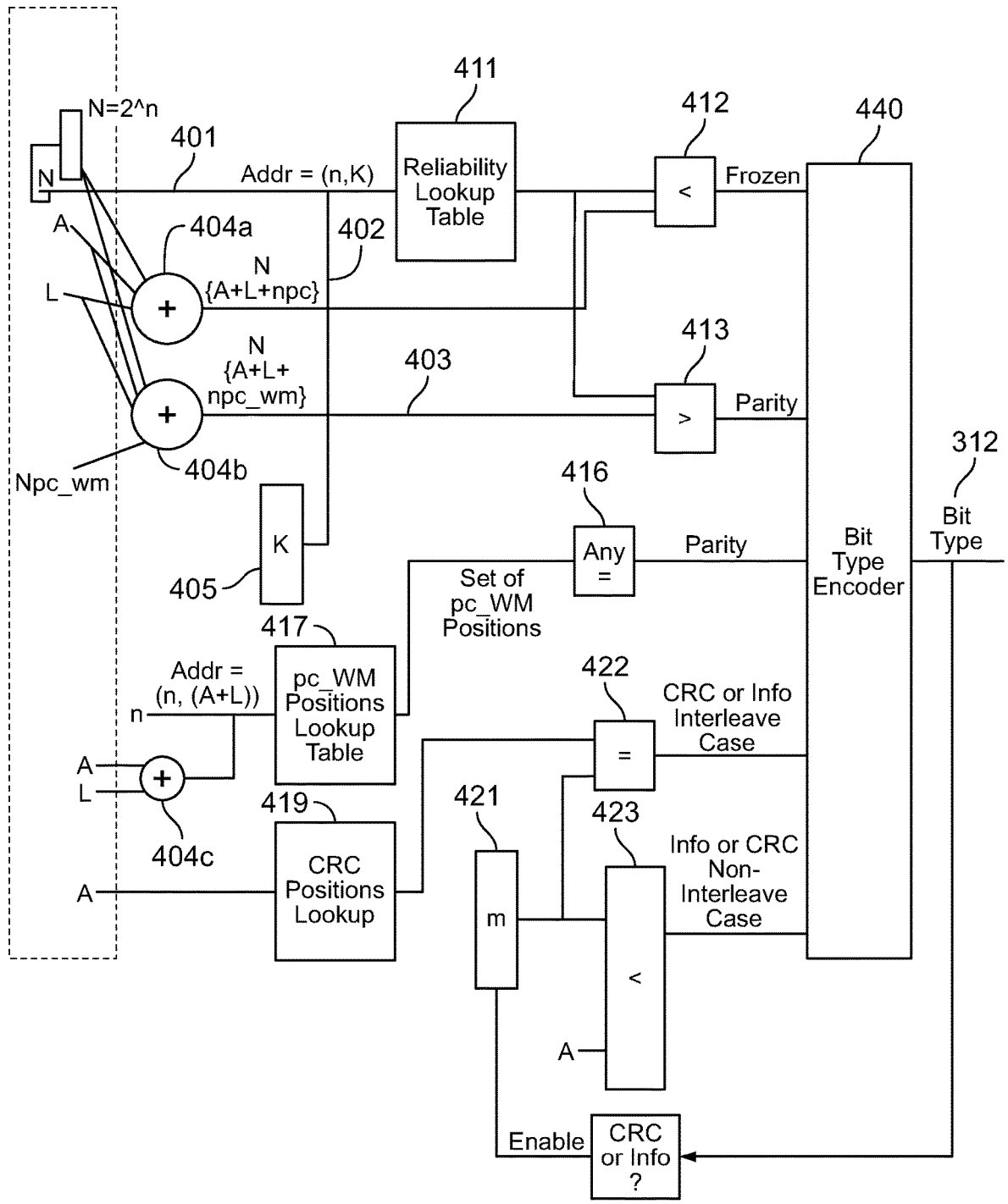
FIG. 4A is a block diagram illustrating an exemplary structure of the code generator shown in FIG. 3.
Figure 4B:
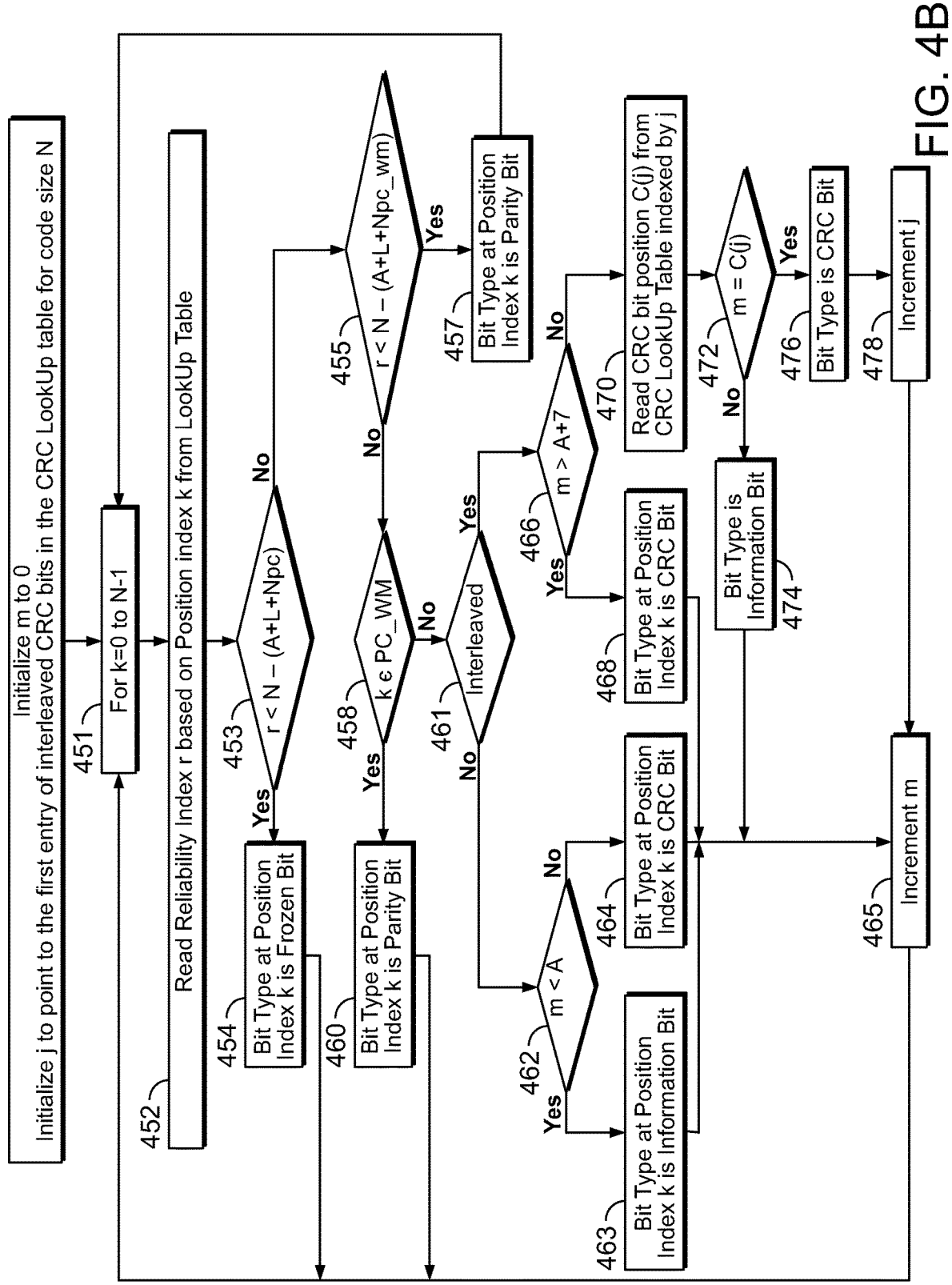
FIG. 4B is a logic flow diagram illustrating a process of operating the structure of code generator shown in FIG. 4A to determine data bit types in the Polar code to be generated, according to embodiments described herein.

In some embodiments, in a transmitter (e.g., a transmitter of 5G systems), a rate matching module 206 is employed. In those embodiments, the Polar code of size N (which includes CRC bits, parity bits and frozen bits that are augmented to the information bits) is to be rate-matched with a rate matching sequence length (E), e.g., derived from the resources allocated for the transmission of the given Polar code. When E≠N, the Polar code is either truncated or repeated to match the rate E, e.g., at the rate matching module 206. If E≥N, the single-loop implementation described in FIGS. 4A-4B is sufficient to generate the given Polar code. When E<N, rate matching influences and alters significantly the bit positions of the Polar encoded data. In this case, rate-matching correction is performed to generate a rate-matching corrected code definition as further described in FIGS. 5A-12B.

In some embodiments, the Polar code 216 may be modulated at a modulation module 208 to form a modulated signal 218 for transmission to a wireless channel.

Figure 3:
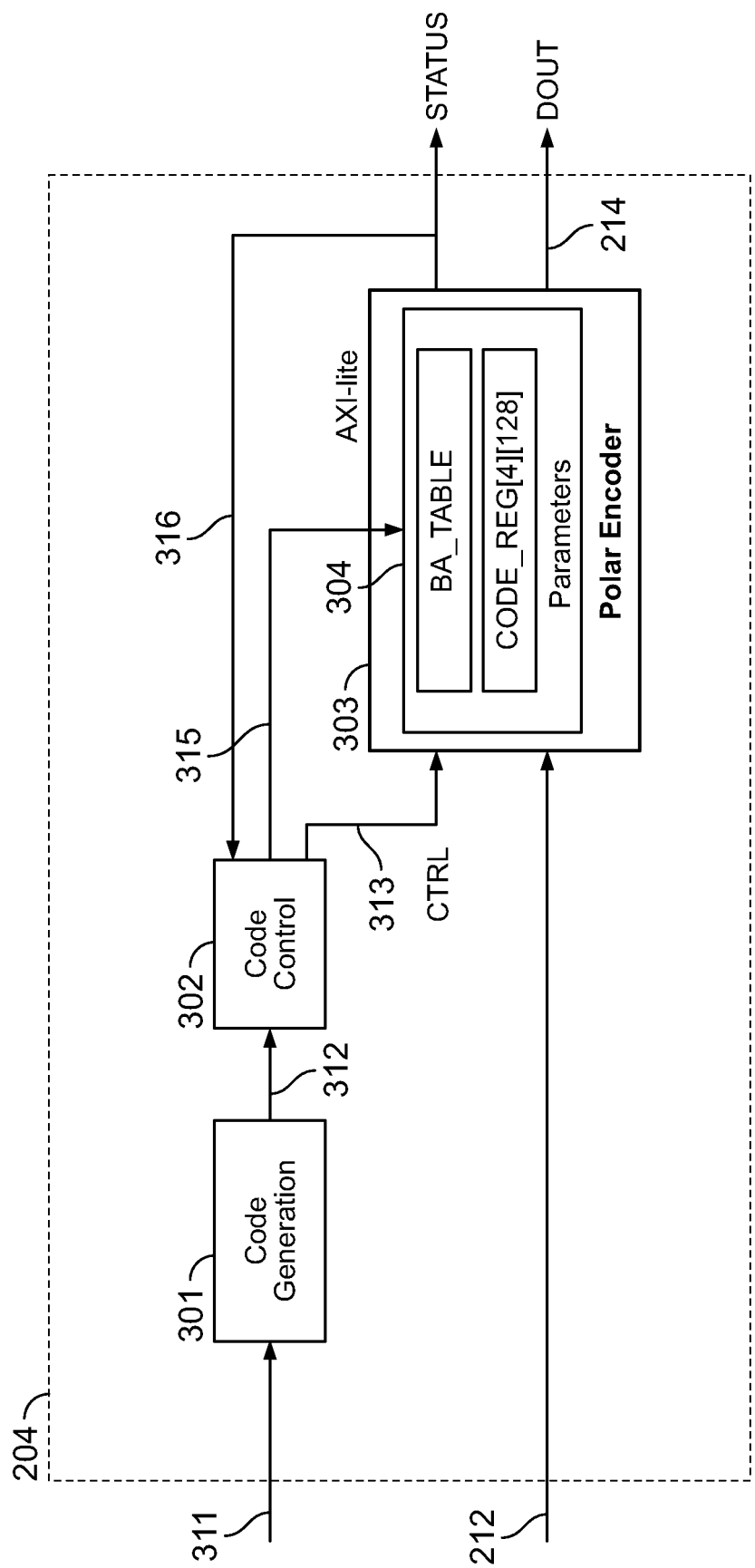
FIG. 3 is a block diagram illustrating an exemplary structure of a Polar encoder with a code generation for determining bit types in the Polar code, according to some embodiments of the present disclosure.

FIG. 3 is a block diagram illustrating an exemplary structure of a Polar encoder 204 with a code generation 301 for determining bit types in the Polar code, according to some embodiments of the present disclosure. Polar encoder 204 includes a code generator 301 that receives coding parameters 311, and outputs a data bit type 312 for each position index in the Polar code to be generated. For example, the input coding parameters 311 may include, but not limited to the number of bits in the code to be generated if no rate matching is required (represented by N) or the number of bits in the code after rate matching if rate matching is required (represented by E), the number of Information bits in the code (represented by A), the number of CRC bits in the code (represented by L), the total number of parity bits in the code (represented by $N_{PC}$), and the number of parity bits whose position is a function of row weight (this type of parity check bit is referred to as PC_WM bits, the number of which is represented by $N_{PC\_WM}$). The row weight is a value derived from the Polar encoding matrix and corresponds to each position index in the Polar code. In some embodiments, the number of bits in the code to be generated N can be derived from the other parameters.

The determined data bit types 312, which form code definitions for the Polar code to be generated, are sent to the code controller 302. The code controller 302 sends a control signal 313 to enable the Polar encoder block 303, and the code definitions 315 to the Polar encoder block 303. The code controller 302 manages and updates code definitions in a Polar encoder parameters store, e.g. at memory 304 within the Polar encoder block 303.

The Polar code encoder block 303 receives data bits to be encoded 212 and encodes the data bits 212 based on encoding parameters such as an encoding matrix stored at memory 304, according to the code definitions 315 to obtain the output Polar code 214. Parameter memory 304 can be reused when there are no code blocks 'in-flight,' e.g., when the status signal 316 indicates a particular code block using a particular code definition has been completed at the Polar encoder block 303.

It is noted that although FIGS. 2-3 shows an example Polar Encoder 204, the code generation block 301 (and embodiments described for code generation throughout the disclosure) may be applied to Polar decoders as well. For example, the Polar encoding block 303 may be replaced by a decoding block, which may use the generated code definitions 315 to decode a Polar code.

FIG. 4A is a block diagram illustrating an exemplary structure of the code generator 301 shown in FIG. 3, and FIG. 4B is a logic flow diagram illustrating a process 450 of operating the structure of code generator 301 shown in FIG. 4A to determine data bit types in the Polar code to be generated, according to embodiments described herein. For each bit index k in the Polar code, the code generator 301 in FIG. 4A determines the bit type 312 of a respective bit position. The circuit of code generator 301 receives an input of coding parameters 311 including N, A, L, $N_{PC}$, $N_{PC\_WM}$, etc., as discussed in relation to FIG. 3. In some embodiments, the input of coding parameters further include an interleave mode indicator In/v.

A counter register 405 is used to store the counter for bit position index k. The coding parameters are input to one or more adders 404a-c to compute one or more values 402 (N−(A+L+$N_{PC}$)), 403 (N−(A+L+$N_{PC\_WM}$)), or a lookup address 401 for a reliability lookup table 411, a PC_WM position lookup table 417, or a CRC positions lookup table 419.

The reliability lookup table 411 stores reliability indices corresponding to bit position indices 0 to N−1 in the Polar code, e.g., a larger value of reliability index indicates that the bit position is more reliable. For example, a range of reliability index value from 0 to N−1 may be assigned to the N bits in the Polar code, indicating a reliability level of each data bit at a particular bit position index. The bit position index corresponding to a larger reliability index value, e.g., N−1 instead of smaller values such as 0 or 1, etc., has a higher reliability level. In some embodiments, multiple reliability lookup tables may be precomputed and stored for each possible size of N such that at run time, a reliability lookup table corresponding to the actual size N may be selected and accessed at runtime. In this way, run-time computation of reliability for various values of N<$N_{max}$ can be avoided and code generation efficiency can thus be improved. For example, in the 5G systems, reliability indices for all possible N sizes (e.g., 32, 64, 128, 256, 512 and 1024) may be pre-computed and stored.

The PC_WM position lookup table 417 stores a set of precomputed bit positions for parity bits whose position is a function of row weight. In some embodiments, multiple PC_WM position lookup tables 417 are pre-computed for each value of N and for each value of A+L, which may be any value from 1 to N.

The CRC position lookup table 419 stores a set of precomputed bit positions for CRC bits. In some embodiments, the reliability lookup table 411, PC_WM position lookup table 417, and the CRC positions lookup table 419 may be stored at a read-only memory (ROM).

The outputs from the lookup tables 411, 417 and 419 are then processed at logic circuits such as comparators 412 and 413, comparator 416, comparators 422 and 423 to determine whether the bit type of bit position k is either frozen, CRC, information or parity based on a series of conditions. Further details of the logic operations of the logic circuits are discussed in relation to FIG. 4B.

The indicators from the logic circuits 412, 413, 416, 422, 423, e.g., whether the bit position index is a frozen bit, a parity bit, a CRC bit or an information bit, are sent to the bit type encoder 440, which encodes the indicators to provide a corresponding bit type 312.

As shown in FIG. 4B, process 450 starts with initializing a counter m representing the number of CRC bits or information bits encountered so far to be 0, an index j that points to the first entry of interleaved CRC bits in the CRC lookup table for the code size N. Process 450 then starts with a counter k which loops from 0 to N−1 at step 451 for every bit position index in the Polar code. Specifically, for each value of counter k, at step 452, the reliability index r corresponding to bit position index k is obtained from a lookup table storing the reliability indices corresponding to bit position indices in a Polar code. For example, as shown in FIG. 4A, the code generator 311 sends a lookup table address in the form of (n, k), where $N=2^n$, to the reliability lookup table 411 to retrieve the corresponding reliability index r.

At step 453, the reliability index r of bit position index k is compared with N minus the sum of the number of information, CRC and parity bits, e.g., whether $r<N-(A+L+N_{PC})$. For example, as shown in FIG. 4A, code generator 301 computes the value 402 $N-(A+L+N_{PC})$ at adder 404a and then sends the value 402 to comparator 412, which in turn compares value 402 with the reliability index r from the reliability lookup table 411.

If $r<N-(A+L+N_{PC})$ at comparator 412, process 450 proceeds to step 454, at which the bit type at position index k is determined to be a frozen bit.

If $r≥N-(A+L+N_{PC})$, process 450 proceeds to step 455, at which the reliability index r of position k is compared with N minus the sum of the number of information, CRC and $N_{PC\_WM}$ bits. For example, as shown in FIG. 4B, code generator 301 computes the value 403 $N-(A+L+N_{PC\_WM})$ at adder 404b and then sends the value 403 to comparator 413, which in turn compares value 403 with the reliability index r from the reliability lookup table 411.

If $r<N-(A+L+N_{PC\_WM})$ at comparator 413, process 450 proceeds to step 457, at which the bit type for bit position index k is determined to be a parity bit. Otherwise, when $N-(A+L+N_{PC\_WM})$, process 450 proceeds to step 458, at which the index position k is compared with a set of precomputed positions PC_WM for parity bits whose position is a function of row weight. For example, as shown in FIG. 4A, code generator 301 computes a lookup address (n, (A+L)) via adder 404c, based on which the set of PC_WM bit positions are retrieved from the PC_WM position lookup table 417. The PC_WM bit positions are then sent to the comparator 416 to determine whether position index k belongs to the set of PC_WM bit positions.

If the position index k belongs to the set of precomputed positions PC_WM, then process 450 proceeds to step 460, at which the bit type of position index k is determined to be a parity bit. Otherwise, when k does not belong to the set of PC_WM bit position indices, the bit type is either an information or CRC bit, and process 450 proceeds to step 461.

At step 461, if the Polar code is not interleaved, process 450 proceeds to step 462. At step 462, if the current count of information bits and CRC bits, represented by m, is less than A, process 450 proceeds to step 463, at which the bit type for position index k is determined to be an information bit. For example, as shown in FIG. 4A, a counter register 421 is used to store the counter m of the currently determined information bits and CRC bits. Comparator 423 is configured to compare the value m of counter 421 with A to determine whether the bit type of position index k is an information bit or a CRC bit.

Otherwise, if m≥A at step 462, process 450 proceeds to step 464, at which the bit type of position index k is determined to be a CRC bit. At step 465, the counter m is incremented by 1.

At step 461, if the Polar code is interleaved, process 450 proceeds to step 466. At step 466, if m>A+7, then the bit type of position index k is determined to be a CRC bit at step 468. Step 468 proceeds to step 465 where the counter m is incremented.

Otherwise, if m≤A+7 at step 466, the CRC bit position C(j) is read from the CRC lookup table indexed by index j at step 470, and compared against the current counter value m at step 472. The process then proceeds to step 474 or 476 from step 472, based on whether the CRC bit position C(j) equals the current counter value m. For example, as shown in FIG. 4A, parameter A is input to the CRC position lookup table 419 to retrieve a set of CRC positions. The comparator 422 determines whether value m from counter 421 equals a value representing the next CRC bit from the set of CRC positions. Index j may be used to register the index of the next CRC bit, denoted by C(j), then the bit type of position index k is determined to be a CRC bit at step 476 when m=C(j). When a CRC bit is determined, the index j is incremented to point to the next CRC index at step 478. Else when m≠C(j) at step 472, the bit type of position index k is determined to be an information bit at step 474. Process 450 then proceeds from steps 474 or 478 to 465, where the counter value m is incremented. Process 450 then proceeds from step 465 to step 451 until all position indices k have been iterated.

In some embodiments, the CRC bit position indices may change with A, the number of information bits. Multiple CRC bit position lookup tables 419 corresponding to different possible values of A may be precomputed and stored. For example, in the case of 3GPP Rel-15 standard, the interleaver has 17 non-interleaved entries at the end of the interleaver, and the maximum number of CRC bits is 24. There are only 7 CRC bit locations to store for each CRC position lookup table, and a total of 140 lookup tables for all possible A values ranging from 1 to 140. The total amount of storage is 7840 bits. When various CRC lengths are required, the CRC bit position lookup table 419 only needs to consider the longest CRC length. Bit positions for smaller CRC lengths can be obtained by omitting the first several CRC bit locations by adding an address offset.

In some examples, e.g., the case of 3GPP Rel-15 standard, only the first 7 CRC bit positions are interleaved amongst information bits and L=24 when interleaved. Thus, a summary comparison for bit position index 8 to 24 of the CRC bits is allowed at step 466. At step 472, the counter m is incremented by 1 when the bit position index k is determined to be either information or CRC.

At step 475, the bit index k is incremented by 1, and the process 450 continues until all bit index k from 0 to N−1 have been processed.

Therefore, process 450 determines the bit types of data bits in the Polar code to be generated with only a single loop through bit positions 0 to N−1.

Figure 4C:
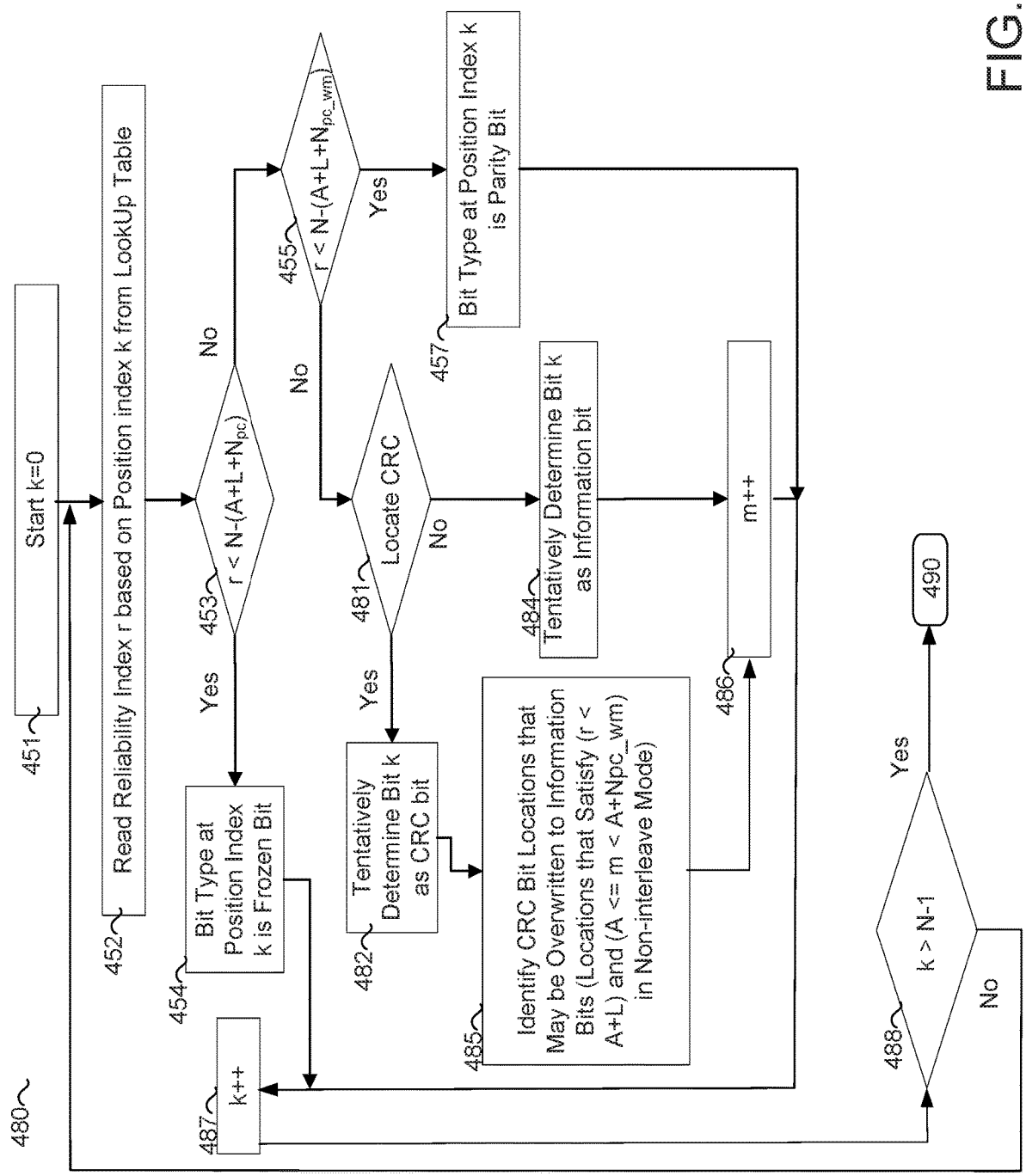
FIG. 4C is a logic flow diagram illustrating an alternative process of operating the structure of code generator shown in FIG. 4A to determine data bit types in the Polar code to be generated, according to embodiments described herein.
Figure 4C:
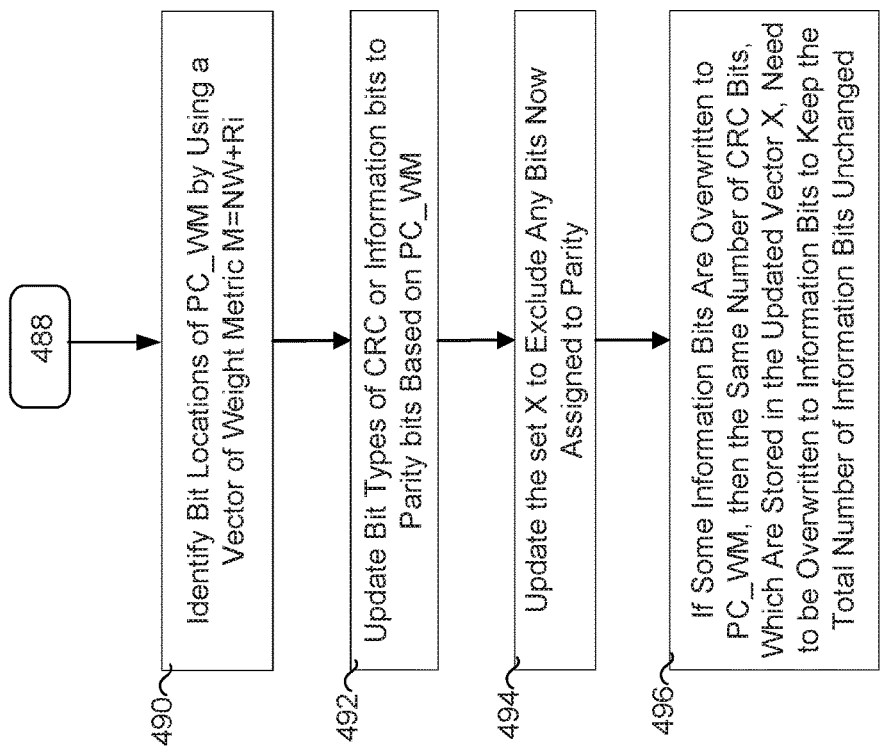

FIG. 4C is a logic flow diagram illustrating an alternative process 480 of operating the structure of code generator 301 shown in FIG. 4A to determine data bit types in the Polar code to be generated, according to embodiments described herein. Process 480 includes similar steps 451-457 as shown in process 450 in FIG. 4B to determine a bit type of frozen bit or a parity bit. Starting at step 481, process 480 employs a run-time search for PC_WM bits without the use of a pre-computed PC_WM position lookup table 417. Specifically, process 480 sets bit types tentatively as information bit or CRC bit while progressively identifying PC_WM bit position indices, and then overwrites the determined bit types at the end when all PC_WM bit position indices have been identified.

Continuing on from step 455, the counter m is compared with the number of information bits A at step 481. At step 481, if a CRC bit can be located at position index k (e.g., when m≥A in the non-interleaving mode), the bit type of position index k is tentatively determined as a CRC bit at step 482, which may be overwritten to information or PC_WM bit later. At step 485, the CRC bit locations that may be overwritten to information bits are identified. Specifically, CRC position indices that satisfy both (r<A+L) and (A≤m<A+$N_{PC\_WM}$) are identified, the set of which is denoted as X. Otherwise, if m<A in the non-interleaving mode, the bit type of position index k is tentatively determined as an information bit at step 484, which may be overwritten to PC_WM bit later.

At step 486, the counter m is incremented by 1. Process 480 then goes through all the bit position indices k through the loop between steps 451 and 486 to set the bit type for all bit position index k=0 to N−1 by incrementing the position index k at step 487, e.g., until k>N−1 at step 488.

After all bit position indices k from 0 to N−1 have been processed, e.g., at step 488 where k has reached the limit, at step 490, bit position indices for PC_WM bits are identified by using a vector of weight metric. Specifically, a new vector of weight metric M=NW+Ri is computed, where W is the vector of weights from the Polar encoding matrix, Ri is the vector of reliability indices in the natural order of bit position indices. The PC_WM bits are located at the places with lowest M metrics for all the bit position indices that satisfy (r≥N−(A+L)). If Y is defined as an $N_{pc\_wm}$ long vector of the smallest metrics from vector M, Z is defined as the vector of corresponding bit position indices for Y. At each bit position index k, the vectors Y and Z can be described according to the following:

For i=0:$N_{pc\_wm}$−1
  If (M(k)<Y(i)) then
    Y($N_{pc\_wm}$−1:i+1)=Y($N_{pc\_wm}$−2:i);
    Z($N_{pc\_wm}$−1:1+1)=Z($N_{pc\_wm}$−2:i);
    Y(i)=M(k); Z(i)=k;
  End
End Here, as $N_{pc\_wm}$ is usually a small number, the above loop can be completely flattened without much hardware resource. Once all the bit position indices for PC_WM bits are located, the vector Z contains all the bit position indices of PC_WM bits with some of which may fall in the set X of CRC position indices that satisfy both (r<A+L) and (A≤A+$N_{PC\_WM}$).

In some embodiments, a metric that combines the weight metric and reliability index may not be used. Instead, bit position indices for PC_WM bits may be determined by first discovering a group of bit position indices {$k_1$, $k_n$} with the lowest row weight of the Polar encoding matrix. If more than one bit position indices correspond to the lowest row weight value, the bit position index $k_h$, with the highest reliability index is selected from {$k_1$, $k_n$} to be a PC_WM bit. Thus, in this way, both the row weights of the Polar encoding matrix and reliability indices need to be stored for each bit position index k. In addition, two variables are required to store the lowest row weight encountered, e.g., $W_{min\_row}$, and the highest reliability index r($W_{min\_row}$) corresponding to the respective lowest row weight.

At step 492, the previously determined bit types of CRC bits or information bits are overwritten to parity bits based on the vector Z (and X) that contains all the bit position indices of PC_WM bits. At step 494, the set X is updated to exclude the bit location indices that are now re-assigned to parity bits. At step 496, if some information bits are overwritten to PC_WM bits, then the same number of CRC bits, which are stored in the updated vector X, need to be overwritten to information bits to keep the total number of information bits unchanged.

In some embodiments, instead of using the CRC bit position lookup table 419 in an interleaver mode shown in FIG. 4A, interleaved Information and CRC bit position indices may be generated at runtime. For example, an interleaver circuit may be used to first create a lookup table of a maximum of (A+L) entries, where each entry indicates whether the bit type corresponding to a respective position index is information bit or CRC bit. This lookup table may be read in order or addressed by the counter m. The algorithm to operate the interleaver circuit may be similar to the interleaver function used in 3GPP Release-15.

Therefore, as shown in FIGS. 4A-4C, the code generator 301 determines the bit types for all bit position indices of the Polar code to be generated in a single loop of the bit indices, resulting in a lower and more deterministic latency compared to the existing mechanism of Polar encoding that involves multiple serially performed operations (e.g., CRC attachment, interleaving, frozen bit filling, information bits placement, etc.), each requiring a separate iteration of all the N bit position indices in the Polar code. The determination of the bit types is implemented by circuit hardware shown in FIG. 4A with several pre-computed lookup tables of small storage sizes, without storing a large lookup store for all possible variations of bit types of a Polar code.

Figure 5A:
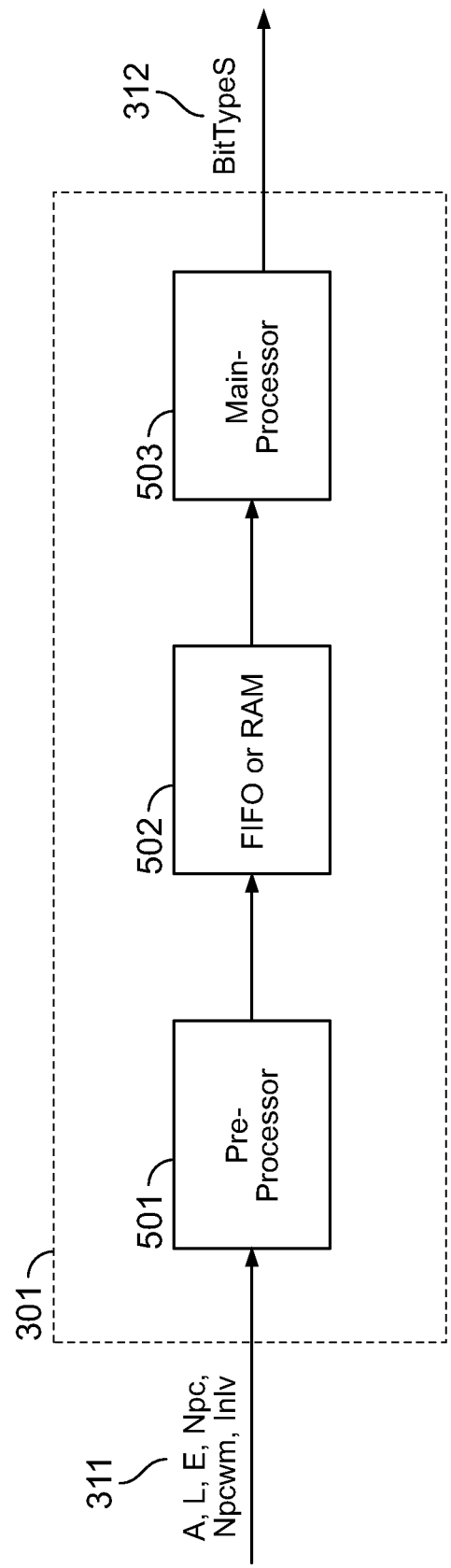
FIG. 5A is a block diagram illustrating an example structure of the code generator for rate matching, according to embodiments described herein.

FIG. 5A is a block diagram illustrating an example structure of the code generator 301 for rate matching, according to embodiments described herein. In 5G systems, each Polar code of size N may need to be rate-matched with a rate matching sequence length (denoted by E), which is derived from the resources allocated for the transport of the given Polar code. If E≥N, the single loop implementation described in FIGS. 4A-4C is sufficient to generate the Polar code. However, when E<N, the size and position of the frozen bits may need to change to match with the length E, which in turn changes the position of Information, CRC and parity bits. Depending upon the coding parameters A, L, E and N, either the start or end bits from the given Polar code may be pushed to be frozen bits. When the bottom bits are pushed to be frozen, the operation is called puncturing. When the top bits are pushed to be frozen, the operation is called shortening. The puncturing or shortening operation is commonly referred to as rate-matching correction (e.g., 206 in FIG. 2). For example, as defined in 3GPP Release 15, when (A+L)/E≤7/16, then the rate matching correction operation type is puncturing. Otherwise, when (A+L)/E>7/16, the rate matching correction operation type is shorting.

The single-loop code generator 301 shown in FIG. 4A may be modified to provide support for rate matching with length E in the generation of Polar codes.

Specifically, as shown in FIG. 5A, the code generator 301 with rate matching includes a first processor 501 (also referred to as a pre-processor 501), a memory 502 and a second processor 503 (also referred to as a main processor 503). The input parameters 311 to the code generator 301 can be similar to those in FIG. 4A, e.g., including the number of information bits A, the number of CRC bits L (6≤L≤24), the number of parity check bits $N_{PC}$, the number of parity check bits determined by row weights $N_{PC\_WM}$, an interleave mode indicator Inlv, and an additional parameter E indicating the number of bits after rate matching. The pre-processor 501 may iterate all bit position indices in the Polar code (but not in the natural bit position order) in one loop to produce preliminary results stored at the memory 502. The types of the preliminary results depend on the types of the memory 502 as discussed below.

The memory 502 may be a first-in-first-out (FIFO) memory or a random access memory (RAM). For a FIFO memory 502, the pre-processor 501 computes the reliability thresholds for determining frozen or non-frozen bits and parity bits for the generation of Polar code and stores the parameters to FIFO memory 502. The FIFO passes the input parameters 311 to the main processor 503, and stores the outputs from the pre-processor 501, such as the number of coded bits N, locations of PC_WM bits, and reliability thresholds of frozen/parity bits based on which the main-processor 503 determines whether a bit position corresponding to a particular reliability index is a frozen or parity bit.

Alternatively, when the memory 502 is a RAM, e.g., a ping-pong memory, the RAM can be used to store results from the pre-processor 501 which indicates whether one bit is one of (a) frozen, (b) parity check or (c) other (information or CRC). In this way, processing tasks at the main-processor 503 may be alleviated as the frozen bit and the parity check bit are determined.

The main-processor 503 may iterate all bit position indices in the Polar code in another loop to generate bit types 312 based on the preliminary results passed on from the pre-processor 501.

Figure 5B:
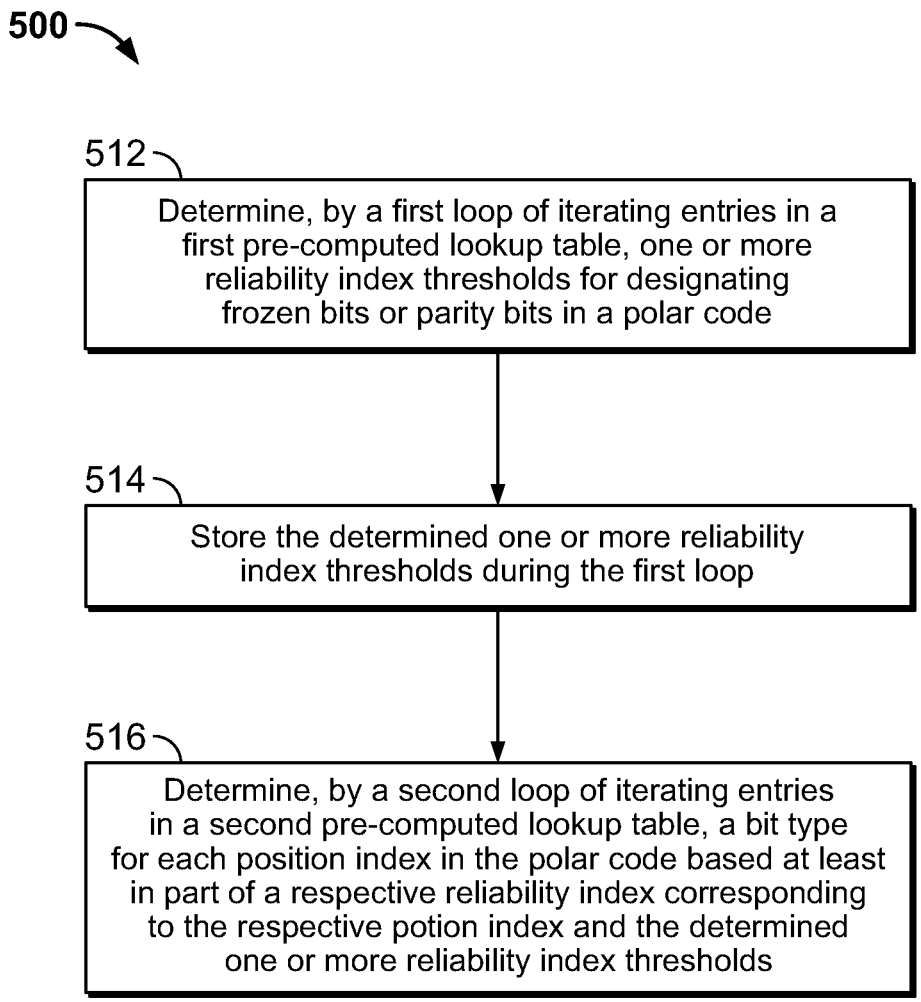
FIG. 5B is a logic flow diagram illustrating a process of a high-level operation of the pre-processor, memory and main-processor shown in FIG. 5A, according to some embodiments described herein.

FIG. 5B is a logic flow diagram illustrating a process 500 of a high-level operation of the pre-processor 501, memory 502 and main-processor 503 shown in FIG. 5A, according to some embodiments described herein. Specifically, process 500 applies to the pre-processor structure 301 shown in FIG. 5A when the memory 502 is a FIFO memory. The operation of the pre-processor 301 when the memory 502 is a RAM is further described in FIG. 6A.

At step 512, process 500 determines by a first loop of iterating entries in a first lookup table at the pre-processor 501, one or more reliability index thresholds (e.g., usually one or a maximum of two thresholds are used) for placing the first non-frozen bits and the first parity bit in the Polar code, respectively. For example, the first lookup table stores bit position indices in the Polar code according to the order of corresponding reliability index from high to low.

At step 514, process 500 stores the determined one or more reliability thresholds at memory 502. At step 516, process 500 determines, by a second loop of iterating entries in a second lookup table at the main-processor 503, a bit type for each position index in the Polar code based on the reliability thresholds.

Figure 6A:
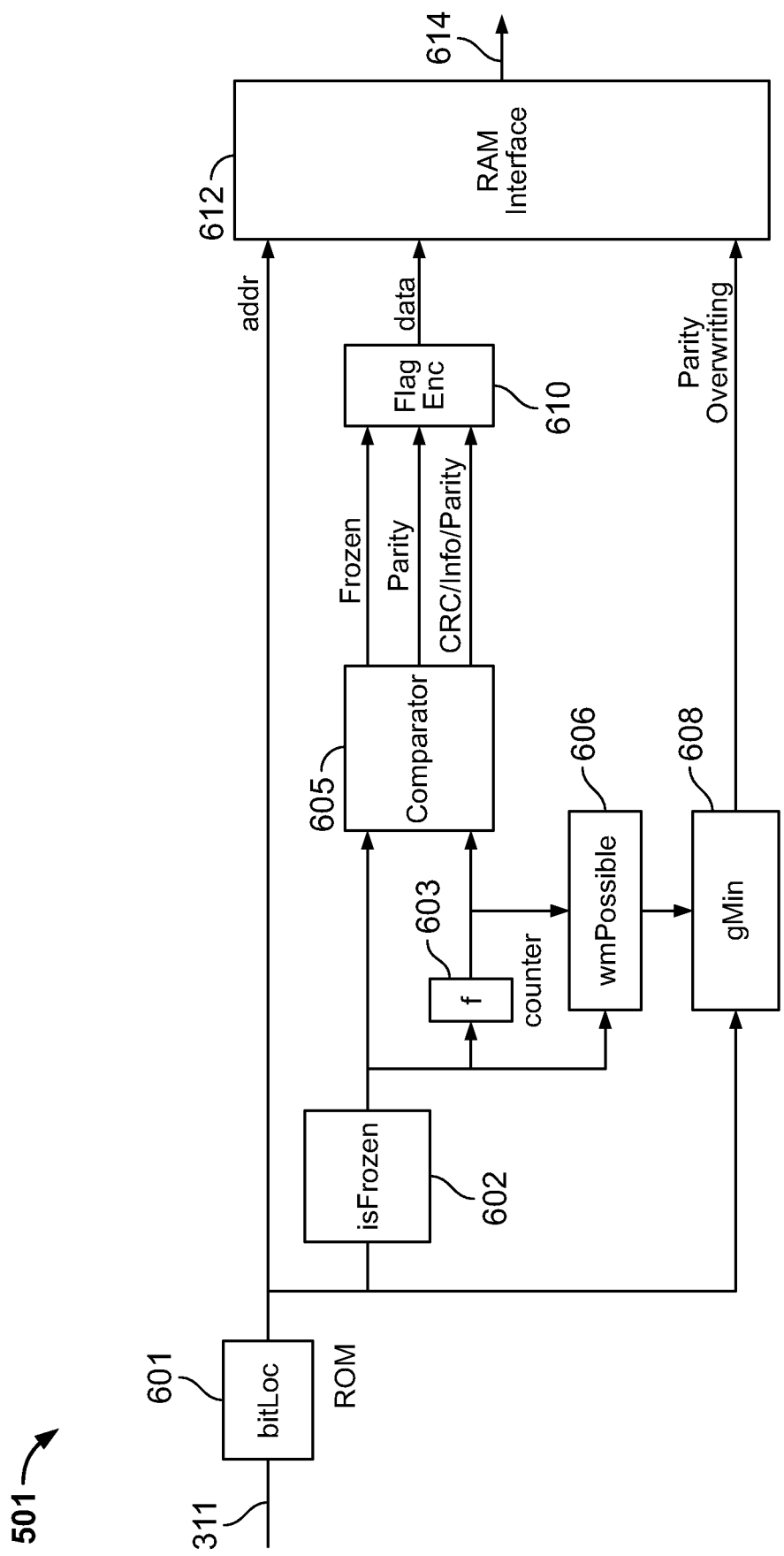
FIG. 6A is a block diagram illustrating a structure of the pre-processor when the memory is a RAM shown in FIG. 5A, according to some embodiments described herein.

FIG. 6A is a block diagram illustrating a structure of the pre-processor 501 when the memory 502 is a RAM shown in FIG. 5A, according to some embodiments described herein. The pre-processor 501 receives the input parameters 311, and then iterates each bit position index on the first lookup table 601. The first lookup table 601 stores the bit position indices in an order of the corresponding reliability indices, e.g., reliability index from high to low.

A isFrozen block 602 is used to determine whether the respective bit position index corresponds to a frozen bit, whose output is sent to comparator 605. The comparator 605 compares a counter f 603 of the non-frozen bits encountered so far (e.g., the total of information bits, CRC bits and parity bits, capped by $A+L+N_{PC}$) with the output of the isFrozen block 602 to generate a comparison result indicating whether the bit position index corresponds to one of (1) a frozen bit, (2) a parity bit, and (3) CRC, information or PC_WM bit. The comparison result is then sent to a flag encoder 610, which encodes the comparison result into a bit type indicator to be passed to the RAM via RAM interface 612.

The pre-processor 501 further includes a wmPossible determination block 606, which receives the counter f 603, and the isFrozen result to determine whether the bit type corresponds to a PC_WM bit. Details of determining a PC_WM bit position index is discussed at 490 in FIG. 4C. The results from the wmPossible block 606 are then sent to the gMin block 608 for updating the minimum row weight of the encoding matrix. After the gMin block 608, the bit position index is determined whether to be overwritten to a PC_WM bit. Further detail of the logic operations between blocks 602, 605, 606 and 608 is discussed in FIG. 7.

The RAM interface 612 is configured to pass pre-processing results 614 to the RAM 502, such as an indication whether the bit position index corresponds to one of (a) frozen, (b) parity check or (c) other (information, CRC or PW_WM) bit.

Figure 6B:
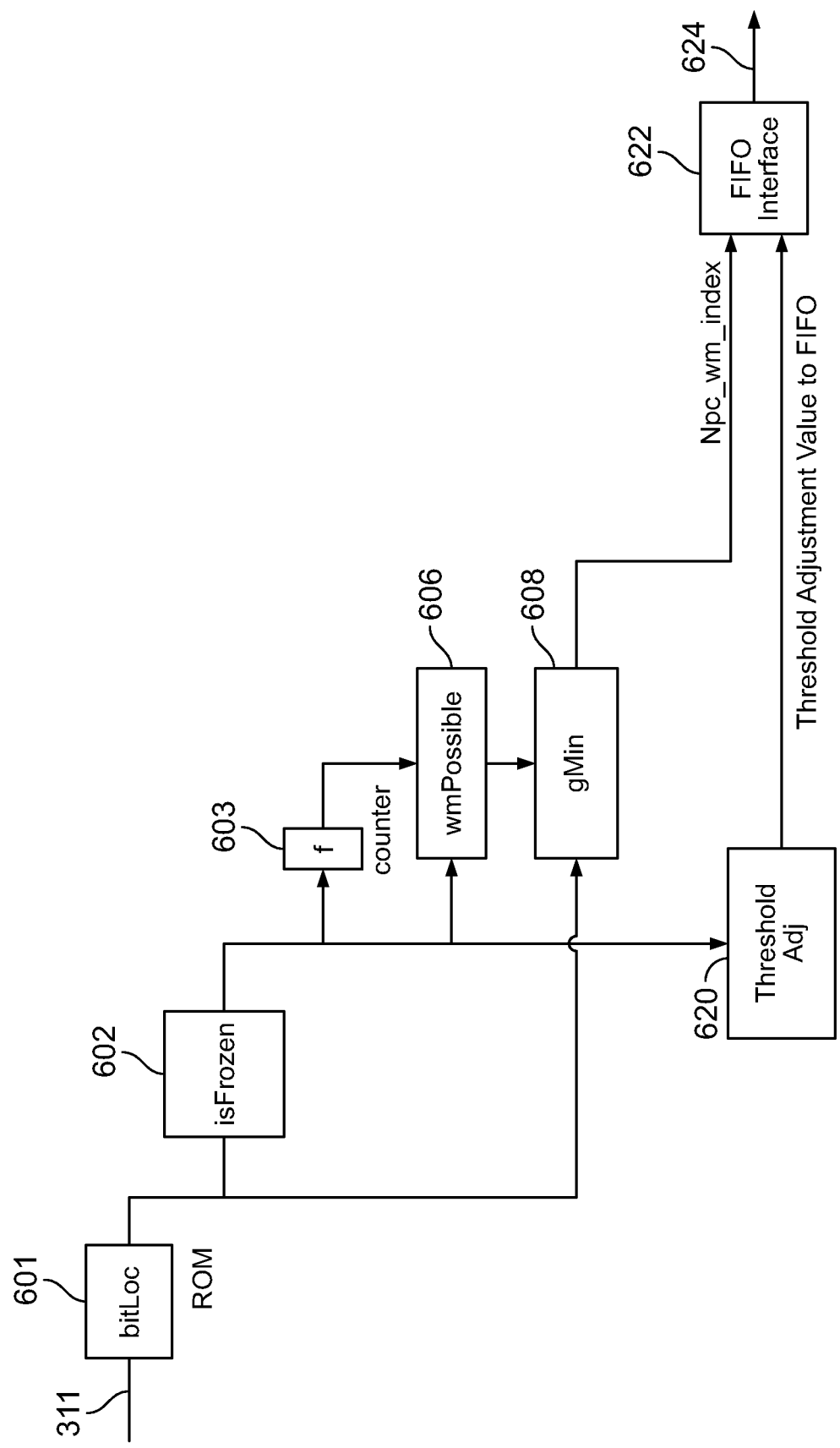
FIG. 6B is a block diagram illustrating a structure of the pre-processor when the memory is a FIFO shown in FIG. 5A, according to some embodiments described herein.

FIG. 6B is a block diagram illustrating a structure of the pre-processor 501 when the memory 502 is a FIFO shown in FIG. 5A, according to some embodiments described herein. When the memory 502 is a FIFO memory, the pre-processor 501 does not preliminarily determine whether a bit position index corresponds to a frozen, parity, CRC/information bit. Instead, the pre-processor 501 computes reliability thresholds for determining frozen or non-frozen bits. Thus, pre-processor 501 includes a threshold adjustment module 620, which receives a result from the isFrozen block 602 and provides a threshold adjustment value to the FIFO interface 622.

The logic blocks 606 and 608 are the same with those in FIG. 6A, which generate a set of PC_WM bit position indices. The FIFO interface 622 then passes the output 624 including locations of PC_WM bits, and reliability thresholds of frozen/parity bits to the FIFO memory 502.

As shown in FIG. 6B, the FIFO method allows for multiple bits to be written to memory in order, e.g. via the FIFO interface 622. When code bits are packed into codewords, the FIFO structure may benefit parallel operations— although the FIFO structure requires to replace a RAM with a small FIFO and an extra ROM, which is generally a small cost in ASIC. The RAM operation shown in FIG. 6A, by its random-access nature, allows for out-of-order bit operations.

Figure 7:
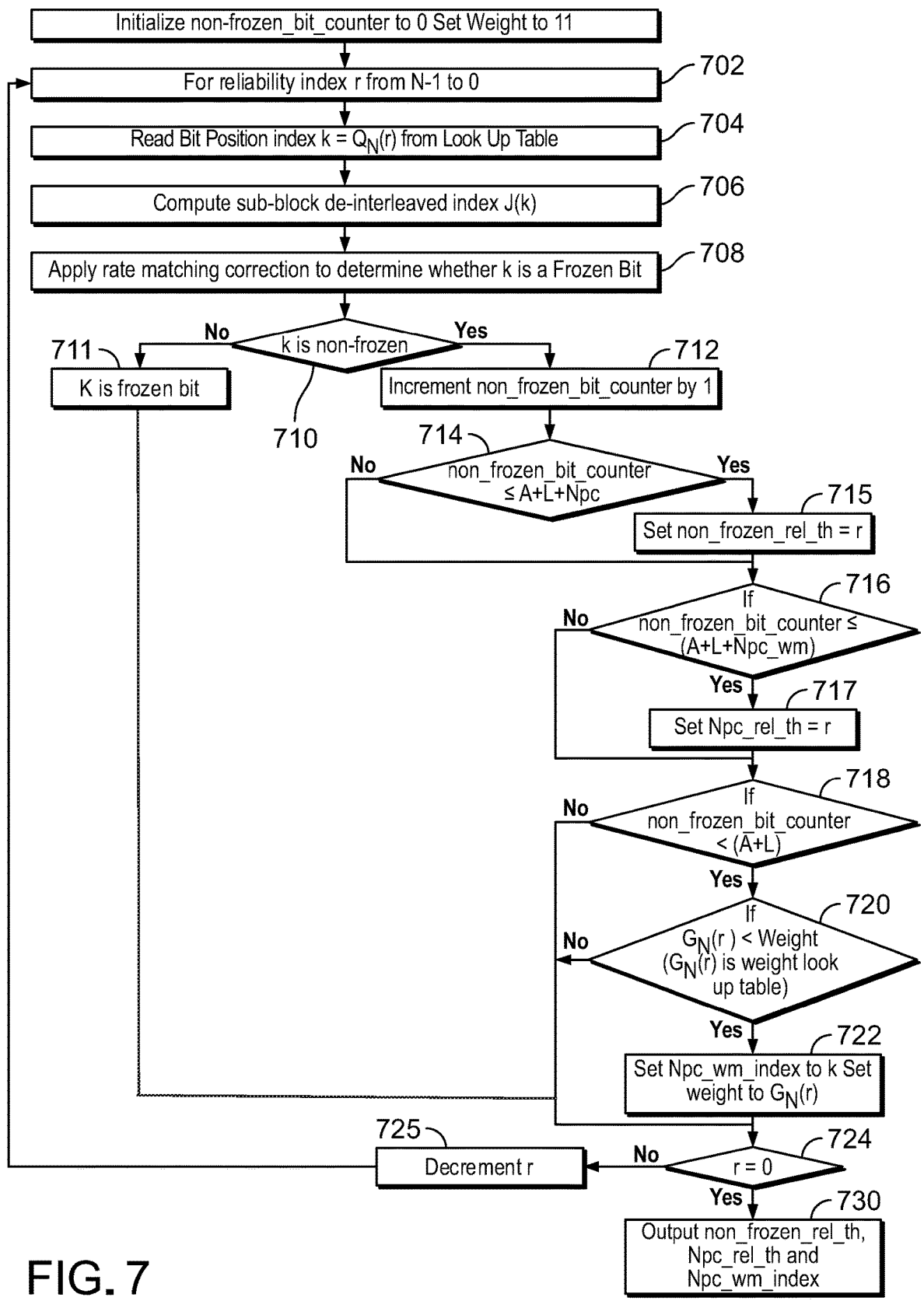
FIG. 7 is a logic flow diagram illustrating a process of an operation of the pre-processor shown in FIG. 6B, according to some embodiments described herein.

FIG. 7 is a logic flow diagram illustrating a process 700 of an operation of the pre-processor 501 shown in FIG. 6B, according to some embodiments described herein. Process 700 starts with initializing the non_frozen_bit_counter to be 0 (e.g., counter f 603 in FIGS. 6A-6B), and a row weight to be "11." Process 700 may iterate all reliability indices from r=N−1 to 0 (high to low) from a lookup table at step 702. The lookup table, represented by $Q_N$, stores bit position indices in reliability index order from high to low, e.g., N−1 to 0. A second lookup table, represented by $G_N$, stores loge of the weight of a respective row of the encoding matrix all reliability indices from r=N−1 to 0. The weight of the respective row of the encoding matrix may be obtained from the $N^{th}$ Kronecker power of $$G_2 = \begin{bmatrix} 1 & 0 \\ 1 & 1 \end{bmatrix}.$$

The log 2 of the weight of row n in the encoding matrix is the number of 1's in the binary representation of the bit index n and may be extracted by counting the number of 1's in the bit index. Thus, an alternative implementation may include a counter that counts the 1's in the binary representation of the bit position index and raise 2 to the power of the count, instead of using the pre-stored lookup table $G_N$.

For each reliability index r, at step 704, a corresponding bit position index $k=Q_N(r)$ is retrieved from the lookup table $Q_N$. At step 706, a parameter J(k) is computed for the bit position index k, which is the sub-block de-interleaved index of k. Details of computing J(k) can be found in 3GPP Release 15.

At step 708, rate match correction is applied to determine whether position index k corresponds to a frozen bit, e.g., at the isFrozen block 602 in FIGS. 6A-6B. Specifically, if no rate matching correction is needed (e.g., E>N), then position index k is determined to correspond to a non-frozen bit. Otherwise, if rate match correction operation type is puncturing, then position index k is determined to correspond to a frozen bit if J(k)<N−E. If E≥3N/4, then position index k is determined to correspond to a frozen bit if k<ceil([3N/4−E/2]). Otherwise, if E<3N/4, position index k is determined to correspond to a frozen bit if k<cell([9N/16−E/4]). If the rate matching correction operation type is shorting, then position index k is determined to correspond to a frozen bit if J(k) E.

At step 710, the position index k is a frozen bit at step 711 when the position index k is not non-frozen after the rate match correction. When position index k is non-frozen after the rate match correction, process 700 proceeds to step 712, at which a counter of Non_frozen_bit_Counter (e.g., counter 603 in FIGS. 6A-6B) is incremented by 1. At step 714, the counter Non_frozen_bit_Counter is compared with (A+L+$N_{PC}$). If Non_frozen_bit_Counter≤(A+L+$N_{PC}$), the first reliability threshold Non_frozen_rel_th is set to be the reliability index r at step 715.

At step 716, if Non_frozen_bit_Counter (A+L+$N_{PC\_WM}$), the second reliability threshold Npc_rel_th is set to be the reliability index r at step 717.

In addition, the positions of the PC_WM bits are determined. At step 718, if Non_frozen_bit_Counter<A+L, the entry $G_N(r)$ is read from the second lookup table $G_N$ at step 720. If $G_N(r)$<Wgt, which denotes the minimum weight (in log 2) of row n of the encoding matrix at step 720, then $N_{pc\_wm\_index}$ is set to be position index k (e.g., at wmPossible block 606), and Wgt is updated to be $G_N(r)$ (e.g., at gMin block 608) at step 722.

Process 700 proceeds from steps 722 to step 724 to determine if the reliability index r has been decremented to 0 (e.g., the smallest reliability index). If not, process 700 proceeds by decrementing the reliability index at step 725 on the lookup table $Q_N$ until all reliability indices are iterated. After all reliability indices have been iterated, process 700 proceeds to step 730, at which the threshold adjustment values Non_frozen_rel_th and Npc_rel_th, $N_{pc\_wm\_index}$ are output to the FIFO memory 502. The output 624 may further include coding parameters from input 311 such as A, N, L, E, $N_{PC}$, $N_{PC\_WM}$, and the determined rate match correction type.

In the 5G system, $N_{PC\_WM}$ is non-zero for only 8 information word sizes (12≤A≤19) and limited to range to 0 and 1. An alternative implementation is to precompute a number $N_{PC\_WM}$ positions for 12≤A≤19, L=6 and A+L+$N_{PC}$≤E≤1024, and store the pre-computed $N_{PC\_WM}$ positions in a lookup table. For an example, when A=12, L=6, $N_{PC}$=3 (thus A+L+$N_{PC}$≤E≤1024), the positions of the $N_{PC\_WM}$ bits can be considered a piece-wise step function of E with maximum steps less than 8. This would imply that the position of the $N_{PC\_WM}$ bits may be extracted and stored in a small lookup table, which can be retrieved efficiently at run-time.

Figure 8A:
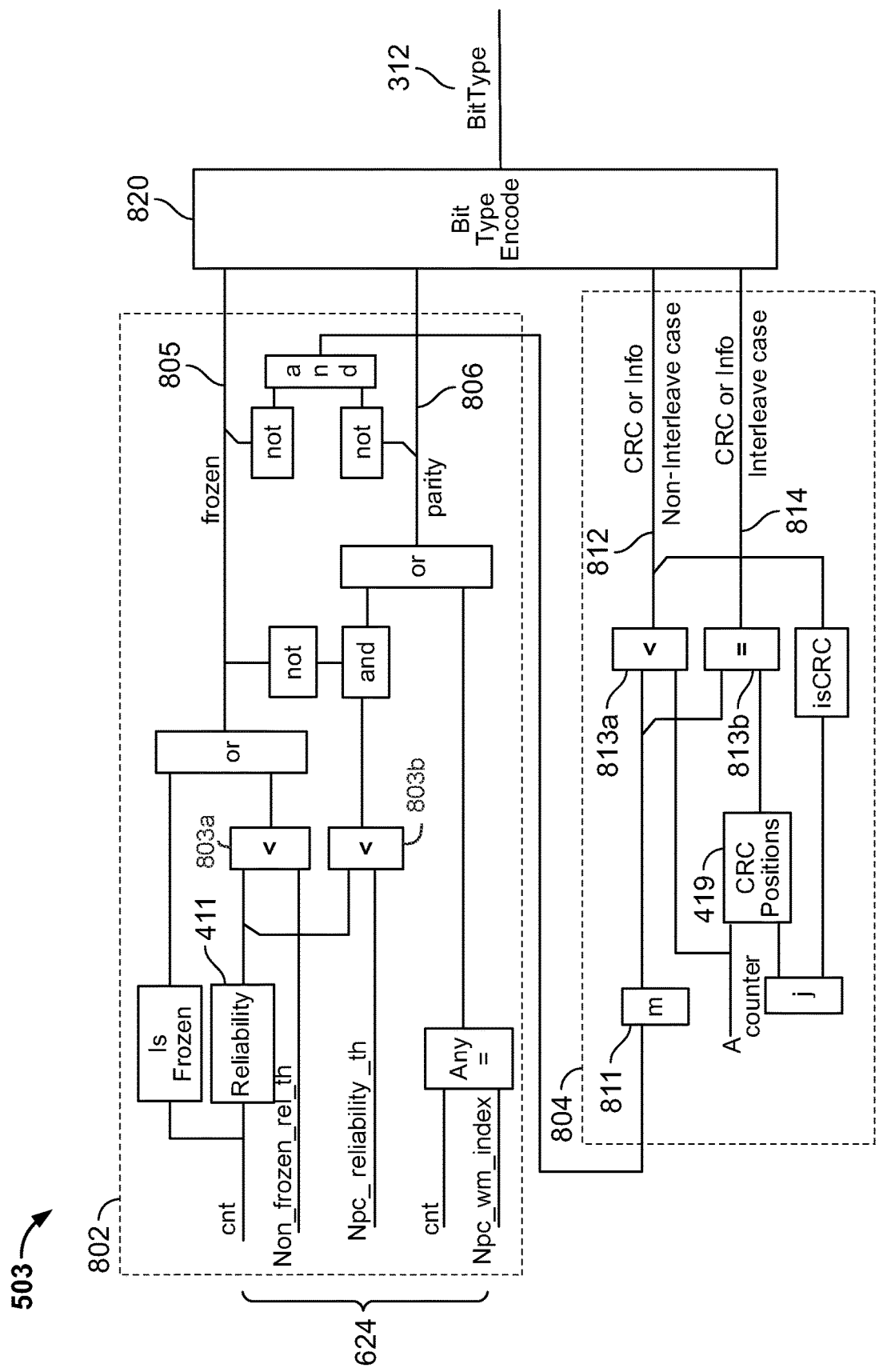
FIG. 8A is a block diagram illustrating the main-processor when the memory is a FIFO memory that passes outputs from the pre-processor shown in FIG. 6B, according to embodiments described herein.

FIG. 8A is a block diagram illustrating the main-processor 503 when the memory 502 is a FIFO memory that passes outputs from the pre-processor 501 shown in FIG. 6B, according to embodiments described herein. Main-processor 503 includes a circuit block 802 for determining a frozen bit or a parity bit for a position index based on the input 624. The input 624 has been passed on by the FIFO memory 502 from the pre-processor 501, including the reliability thresholds Non_frozen_rel_th and Npc_rel_th, and the set of PC_WM position indices.

The circuit block 802 includes a counter used to iterate a reliability lookup table 411 that stores the reliability indices in the natural order of the bit position indices. The reliability lookup table 411 may be stored in a ROM, the address to which is the bit position indices (0 to N−1) and the value read from the ROM is the reliability of the bit position index.

The circuit block 802 includes a comparator 803a, which compares the reliability index r from the reliability lookup table with the first threshold Non_frozen_rel_th to determine whether the position index n is a frozen bit. The circuit 802 includes a comparator 803b, which compares the reliability index r from the reliability lookup table with the first threshold Npc_rel-_th to determine whether the position index n is a parity bit. The results of the comparators 803a-b, together with an output from the isFrozen block 602 similar to the isFrozen block 602 in FIGS. 6A-6B, are used to determine whether a respective bit position index n corresponds to frozen bit 805 or a parity bit 806. Details of the logic operations are described in relation to FIG. 8C.

The main-processor 503 further includes a circuit block 804 for determining CRC or information bits in interleaved or non-interleaved modes. Circuit block 804 includes a count register 811 of the count m of CRC or information bits encountered so far. A CRC position lookup table 419 is accessed to output a next CRC bit position index. Specifically, a comparator 813b compares the next CRC bit position index with the counter m to determine whether the bit position index corresponds to a CRC or information bit 814 for an interleaved case. A comparator 813a compares the count m with parameter A to determine whether the bit position index corresponds to a CRC or information bit 812 for a non-interleaved case. Further operations within the circuit block 804 are discussed in relation to FIG. 8C.

The determined bit types 805, 806, 812 and 814 are encoded by the bit type encoder 820 to output a bit type 312.

Figure 8B:
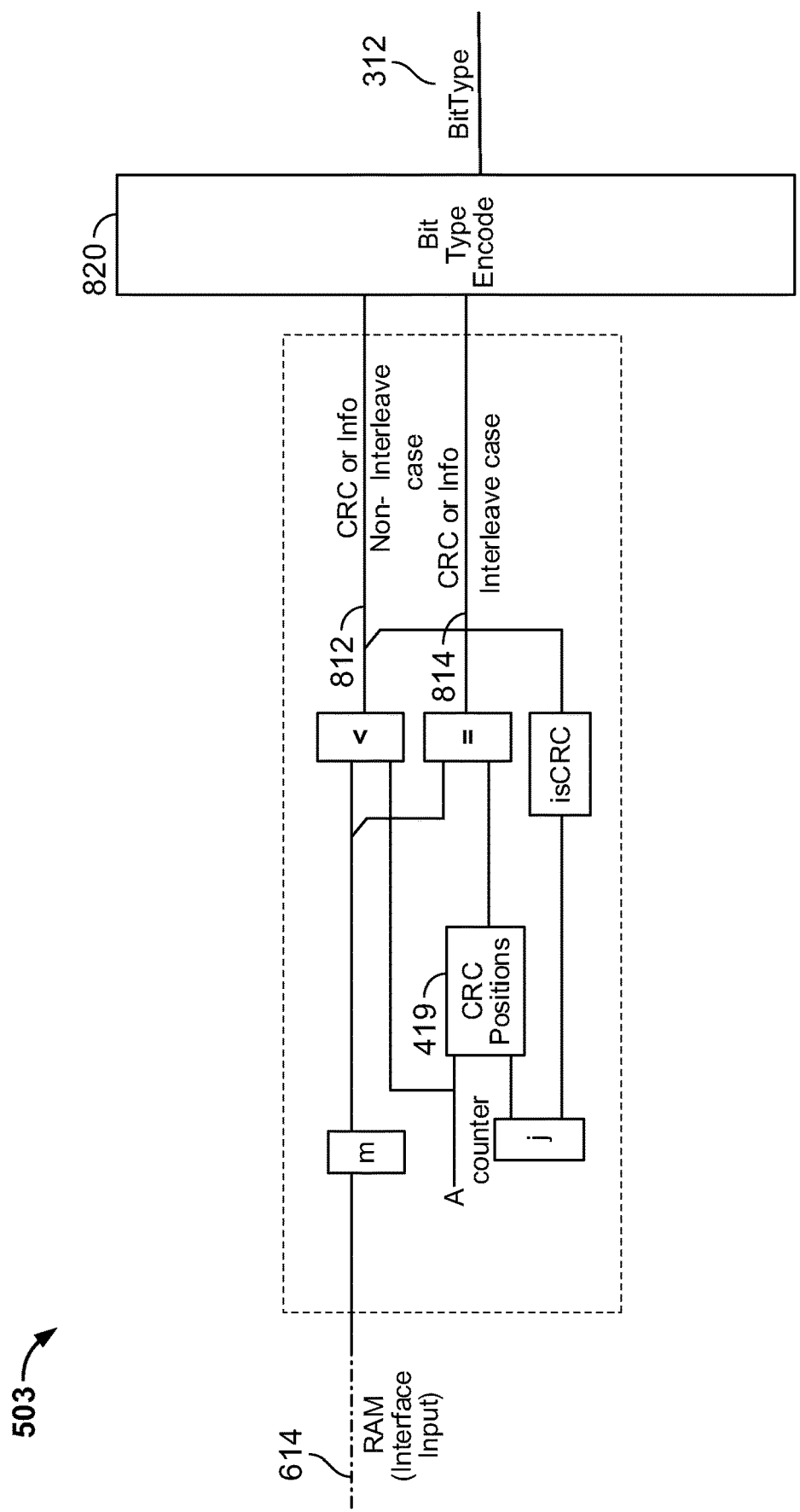
FIG. 8B is a block diagram illustrating the main-processor when the memory is a RAM that passes outputs from the pre-processor shown in FIG. 6A, according to embodiments described herein.

FIG. 8B is a block diagram illustrating the main-processor 503 when the memory 502 is a RAM that passes outputs from the pre-processor 501 shown in FIG. 6A, according to embodiments described herein. When the memory 502 is a RAM, the pre-processor 501 shown in FIG. 6A has already determined bit types of frozen or parity. Thus the main-processor 503 only needs to determine CRC or information bit types. Therefore, main-processor 503 shown in FIG. 8B only includes the circuit block 804 shown in FIG. 8A, with an additional RAM input interface to receive input 614 (discussed in FIG. 6A) from the RAM 502.

Figure 8C:
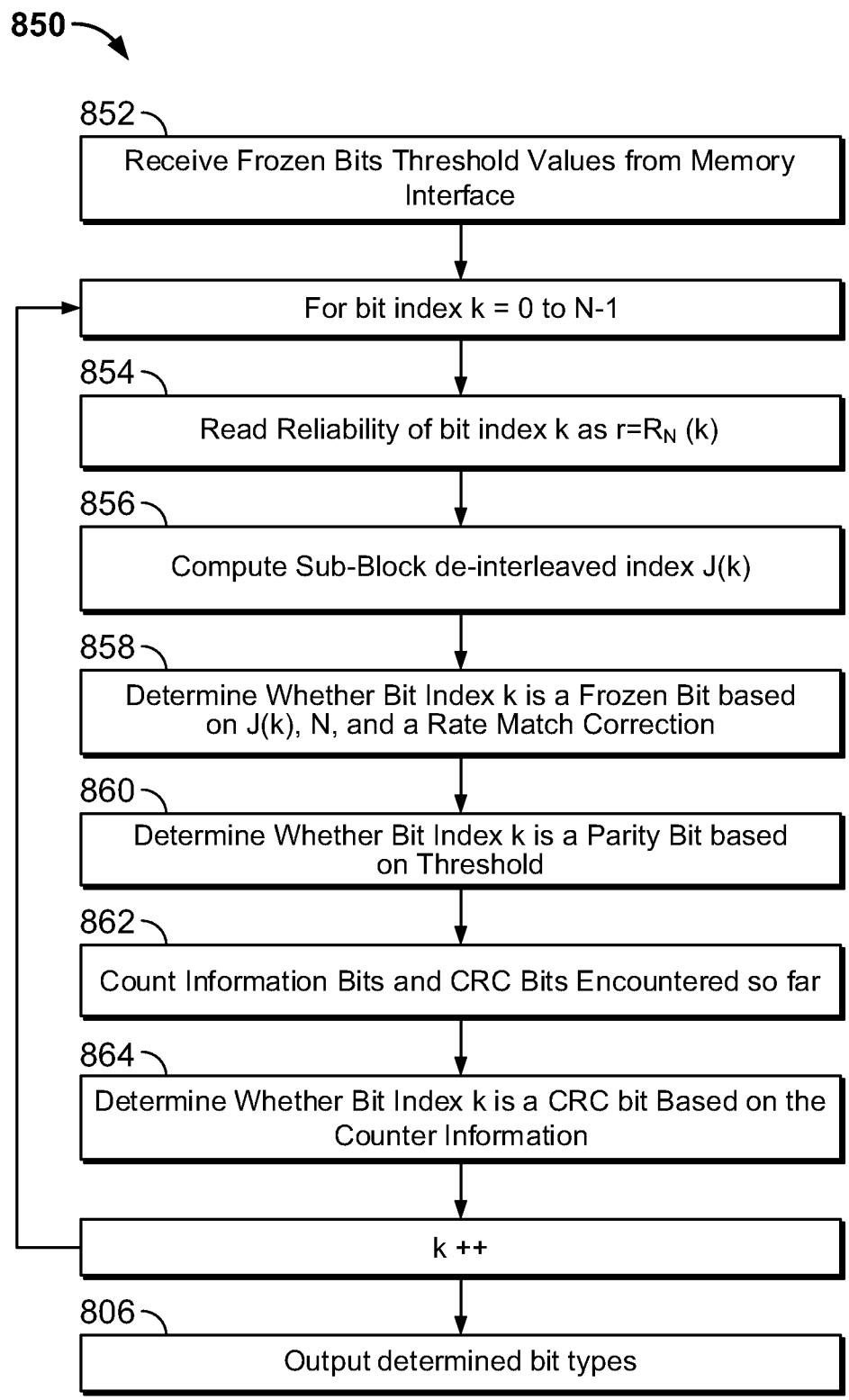
FIG. 8C is a logic flow diagram illustrating a process of an operation of the main-processor shown in FIG. 8A, according to some embodiments described herein.

FIG. 8C is a logic flow diagram illustrating a process 850 of an operation of the main-processor 503 shown in FIG. 8A, according to some embodiments described herein. At step 852, reliability threshold values and other parameters (e.g., 624) are received from a FIFO memory interface. Process 850 iterates for all bit indices k=0 to N−1. For each bit index k, at step 854, a reliability index r of bit index k is obtained as r=$R_N$(k), where $R_N$ represents the reliability lookup table 411 shown in FIG. 8A. At step 856, the sub-block de-interleaved index J(k) is computed, in a similar way as in step 706 in FIG. 7. At step 858, process 850 determines whether the bit index k is a frozen bit or non-frozen bit based on J(k) and a rate match correction type. Specifically, reliability index r is compared with the threshold Non_frozen_relth (at comparator 803a shown in FIG. 8A). If r≥Non_frozen_rel_th, then position index k is determined to be a non-frozen bit. In addition, step 858 further determines whether bit position index k is a frozen bit based on the rate matching correction type, e.g., by the isFrozen block 602 in FIG. 8A, the details of which is described at step 708 in FIG. 7.

At step 860, process 850 determines whether the bit index k is a parity bit based on the reliability threshold Npc_rel_th. Specifically, if $N_{PC}$>0 and bit position index k is a non-frozen bit, then the reliability index r is compared with the threshold Npc_rel_th, e.g., at comparator 803b shown in FIG. 8A. If r<Npc_rel_th, then bit index k is determined to be a parity bit. If $N_{PC\_WM}$>0 and the bit position index k=$N_{PC\_WM\_Index}$, then bit index n is also determined to be a parity bit.

At step 862, the number of the information bits and CRC bits encountered so far is tracked and updated at count register 811 in FIG. 8A. For example, if bit position index k is neither a frozen nor a parity bit from steps 858 and 860, then bit index k is either an information or CRC bit. The counter m at count register 811 is incremented by 1.

At step 864, process 850 determines whether the bit index k is a CRC bit based on the counter information. Specifically, when CRC interleaving is enabled, then if m>A+7 (e.g., at comparator 813a) and bit index k is a non-frozen bit, bit position index k is determined to be a CRC bit. Otherwise, if bit position index k equals to a CRC position on the CRC position lookup table 419 (corresponding to parameter A), e.g., compared at comparator 813b, then bit position index k is determined to be a CRC bit, and a count register 819 of count j representing the number of CRC bits encountered so far is incremented by 1. Otherwise, if bit position index k satisfies none of the above conditions for a CRC bit, bit position index k is determined to be an information bit.

Upon completing step 864, process 850 increments the bit position index by 1 and repeats the iteration of steps 854-864.

Figure 9:
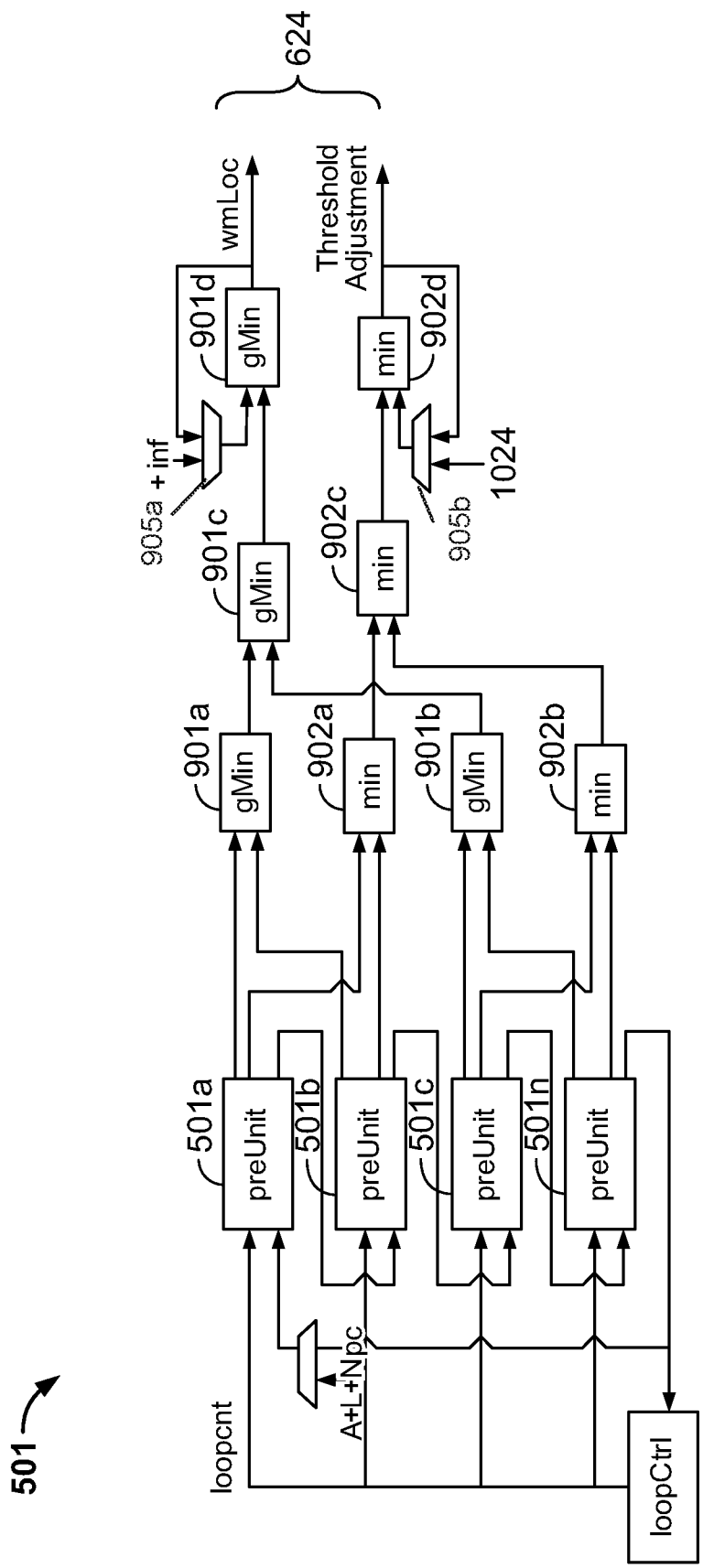
FIG. 9 is a block diagram illustrating a structure of the pre-processor having parallel processing units, according to embodiments described herein.

FIG. 9 is a block diagram illustrating a structure of the pre-processor 501 having parallel processing units 501a-n, according to embodiments described herein. As shown in FIGS. 6A-6B, the pre-processor 501 does not perform any write operation in the first loop of iterating reliability indices from high to low, which allows parallel processing of the first loop. The degree of parallelism may be increased to N, e.g., a maximum number N of parallel pre-processing units 501a-n may be used, each of which is configured to perform the similar function that the pre-processor structure shown in FIG. 6A or 6B performs. Thus, the entire first loop can be completed in one cycle, with each pre-processing unit 501a-n handling a respective reliability index and a respective bit position index.

Specifically, when the memory 502 is a FIFO memory, each pre-processing unit 501a-n has a similar structure as the structure shown in FIG. 6B. Each pre-processing unit 501a-n generates a threshold adjustment value (e.g., see threshold adjustment value 620 in FIG. 6B) for reliability thresholds, and the threshold adjustment values from the pre-processing units 501a-n are aggregated via minimum operation blocks 902a-d to output the actual threshold adjustment value for the reliability thresholds as part of the pre-processor output 624. The multiplexer 905b selects between a pre-determined maximum value (e.g., 1024) and the current threshold adjustment to output to the min block 902d to generate the updated threshold adjustment value. Similarly, each processing unit 501a-n generates a PC_WM bit location. The PC_WM bit location indicators from pre-processing units 501a-n are used in gMin blocks 901a-d to update the parameter Wgt, the minimum weight (in log 2) of a respective row of the encoding matrix (e.g., see gMin block 608 in FIG. 6B) and aggregate a final set of the PW_WM bit locations as part of the pre-processor output 624. The multiplexer 905a selects between a pre-determined minimum value and the current PW_WM bit location to generate an output to the gMin block 901d to generate the updated PW_WM bit location.

Figure 10:
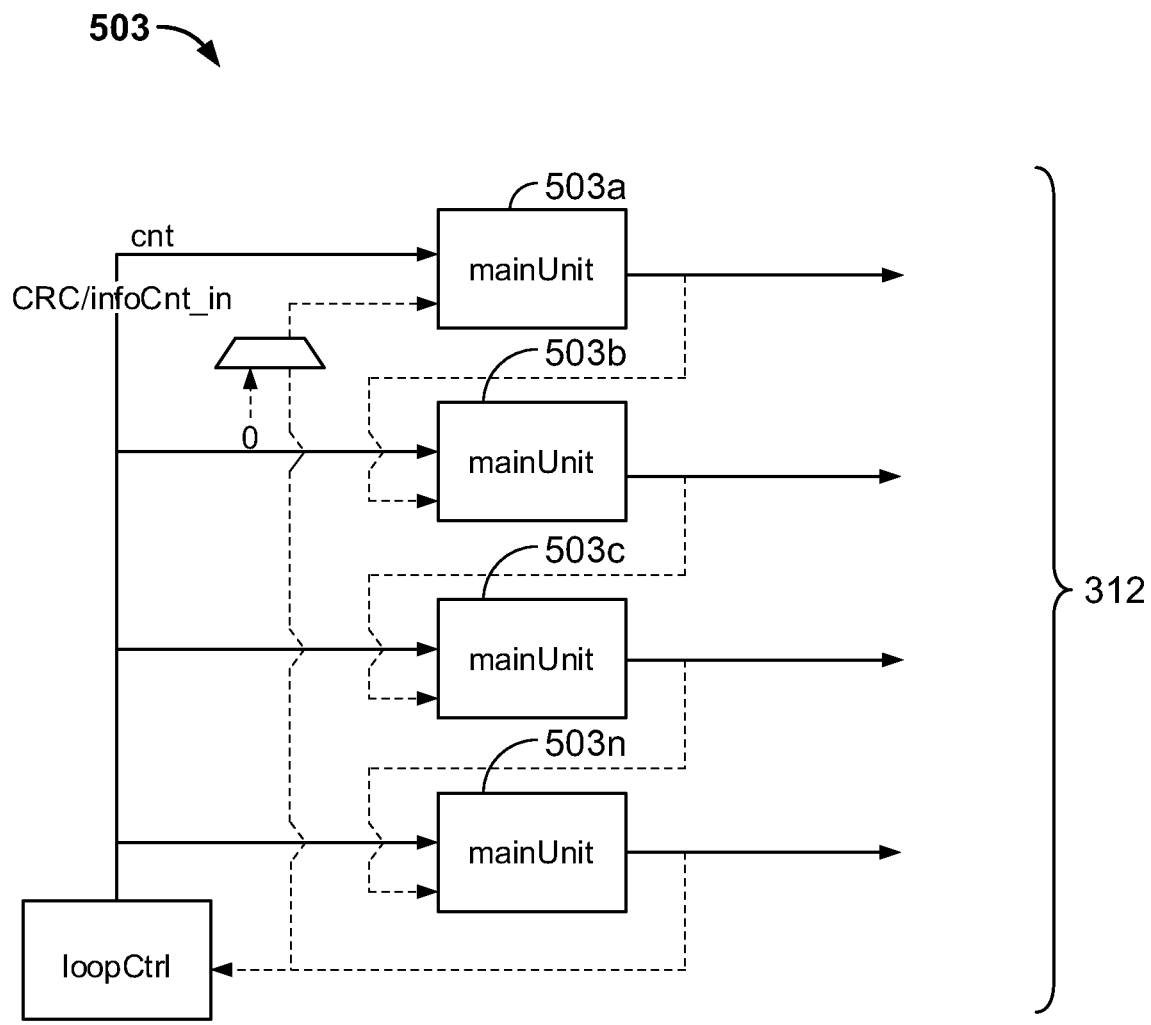
FIG. 10 is a block diagram illustrating a structure of the main-processor having parallel processing units, according to embodiments described herein.

FIG. 10 is a block diagram illustrating a structure of the main-processor 503 having parallel processing units 503a-n, according to embodiments described herein. As shown in FIGS. 8A-8B, due to sequential addressing, the ROM storing the reliability lookup table 411 may be arranged to allow reading of reliability values for the entire N reliability indices in parallel in order to support processing of the entire N bit position indices in parallel. Specifically, the structure of main-processor 503 includes a maximum number N of main units 503a-n, each of which has a structure similar to the structure shown in FIG. 8A or 8B. Each main unit 503a-n is configured to determine a bit type for a specific bit position index. Thus, the set of N parallel main units 503a-n may determine N contiguous bit types 312 in one cycle. These can be written in parallel to a table BA_TABLE in 304 that is configured with a wide memory capable of storing multiple bits per address. In this way, the parallel computation may be performed in order.

FIG. 11 is a logic flow diagram illustrating an alternative process 1100 of determining bit types with rate match correction, according to some embodiments described herein. Specifically, process 1100 employs two loops of iterating entries from two lookup tables $Q_N$ and $G_N$. The two lookup tables $Q_N$ and $G_N$ are similar to the two lookup tables discussed in relation to FIG. 7.

Specifically, at step 1101, a set of data bits are received for encoding into a Polar code having a size N. Each data bit from the Polar code corresponds to a respective position index in the Polar code.

At step 1102, process 1100 determines, by a first loop of iterating entries of the lookup table $Q_N$ in an order from reliability r (e.g., from 0 to N−1), the respective bit index read from $Q_N$ for reliability index r is a frozen bit or a parity bit. Specifically, the respective bit index is checked for rate-matching correction to confirm whether the bit is forced to be Frozen or lie in the allocated region. In the first loop, bit position indices of frozen and parity bits are located. The determined bit types from the first loop associated with the corresponding bit position indices are stored in an intermediate RAM.

At step 1103, process 1100 determines, by a second loop of visiting the intermediate RAM in bit index order, the respective bit index is an Information, CRC or PC_WM bit. Specifically, in the case of interleaved CRC, the CRC positions are located by reading from a CRC position lookup table (e.g., 419 in FIG. 4A).

At step 1104, the final Polar code is generated based at least on the determined data bit types corresponding to the position indices.

In some embodiments, process 1100 may be implemented on FPGA (e.g., 100 in FIG. 1) which consumes less resources.

Figure 12A:
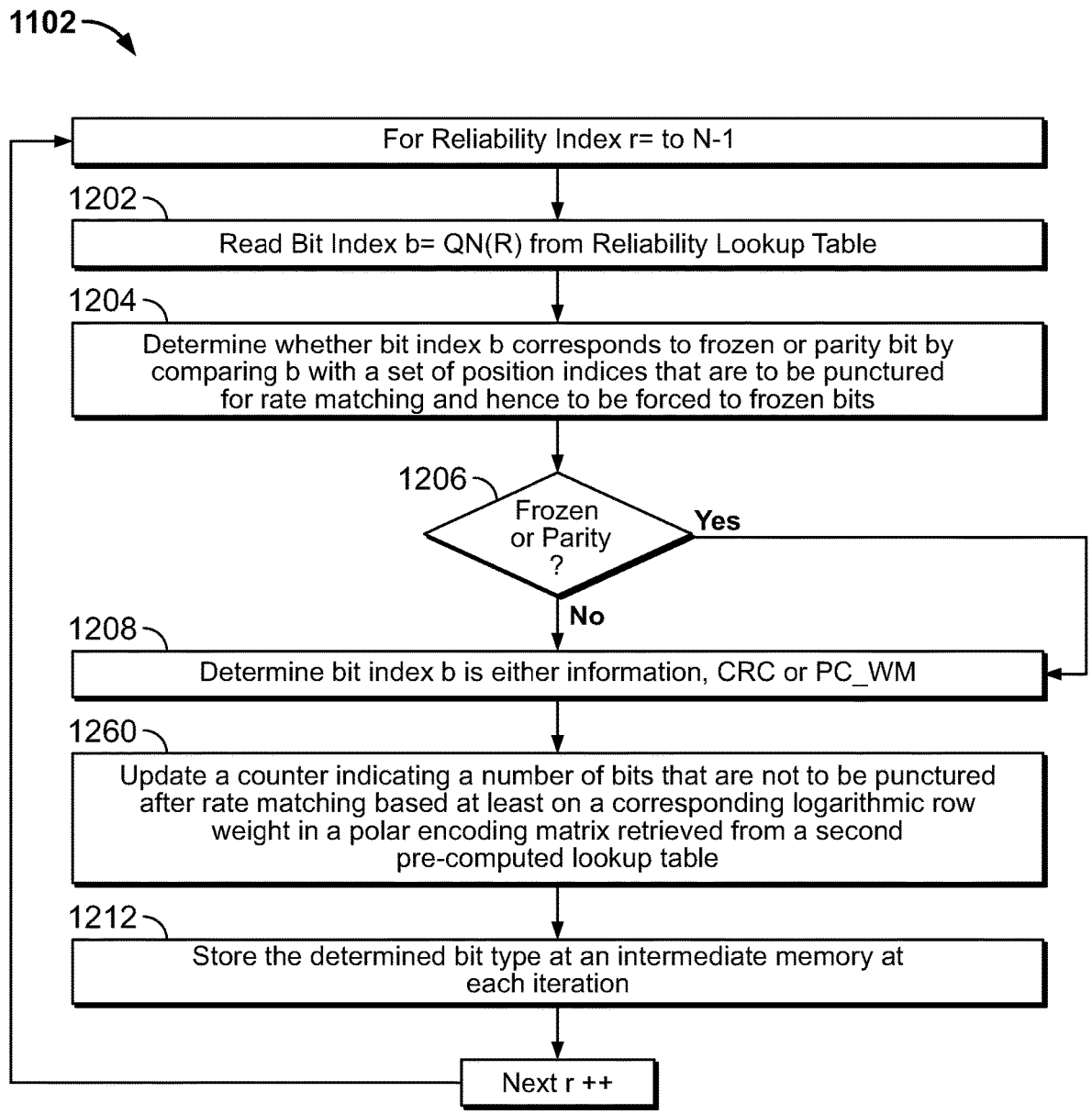
FIG. 12A is a logic flow diagram illustrating the first loop of process in FIG. 11, according to some embodiments described herein.

FIG. 12A is a logic flow diagram illustrating the first loop 1102 of process 1100 in FIG. 11, according to some embodiments described herein. In some embodiments, the number of coded bits, N, is derived from the input parameters E and A+L, which requires the calculation of $\lceil \log_2 E \rceil$ and $\lceil \log_2(A+L) \rceil$. The ceiling operation is converted to a floor operation by using the equation $\lceil \log_2 x \rceil = \lfloor \log_2(2x-1) \rfloor$, and the C function ceillog2(x) is used to locate the first non-zero bit of (2x−1).

As discussed in relation to FIG. 11, the first loop 1102 iterates for reliability index r=0 to N−1. Prior to the first loop, a counter i is set to be 0, and a parameter gmin is set to be the maximum value, e.g., 11 in 5G systems. For each reliability index r, at step 1202, the bit position index $b = Q_N(r)$ is read from the lookup table $Q_N$.

At step 1204, bit type of the bit index b is determined as whether to be a frozen or parity bit, by comparing b with a precomputed set $F_E^{A=L}$. The precomputed set $F_E^{A=L}$ denotes the set of bit locations that should be excluded from the set of information and parity bits. These bits will be punctured in rate matching and should be forced to frozen bits. In some examples, the set Fr' is described by a few thresholds for comparison to determine whether the bit position index b should be forced to frozen.

If $b \in F_E^{A=L}$ or $i \geq (A+L+N_{PC})$, the bit type of bit index b is determined to be frozen. Otherwise, if $i \geq (A+L+N_{PC\_WM})$, the bit type of bit index b is determined to be a parity bit.

At step 1206, if the bit type is determined not to be frozen or parity, the bit type of bit index b is set to be an information bit temporarily (with the possibility that it could be information, CRC or PC_WM) at step 1208.

At step 1210, when $b \notin F_E^{A=L}$, the counter i indicating the number of bits that are not to be punctured after rate matching and the parameter gmin are updated. Specifically, the row weight value is read from the lookup table $g = G_N(r)$, the log 2 of the weight of the rth row in the coding matrix. If g<gmin and i<(A+L), then gmin=g and the bit index b is recorded, e.g., w=b. The counter i is incremented by 1.

At step 1212, the determined bit type associated with the bit position index b is written in an intermediate RAM.

The first loop 1102 then proceeds to the next reliability index and repeats steps 1202-1212. When the first loop 1102 is completed, if $N_{PC\_WM}>0$, then the recorded bit index b is determined to be a parity (PC_WM) bit.

Figure 12B:
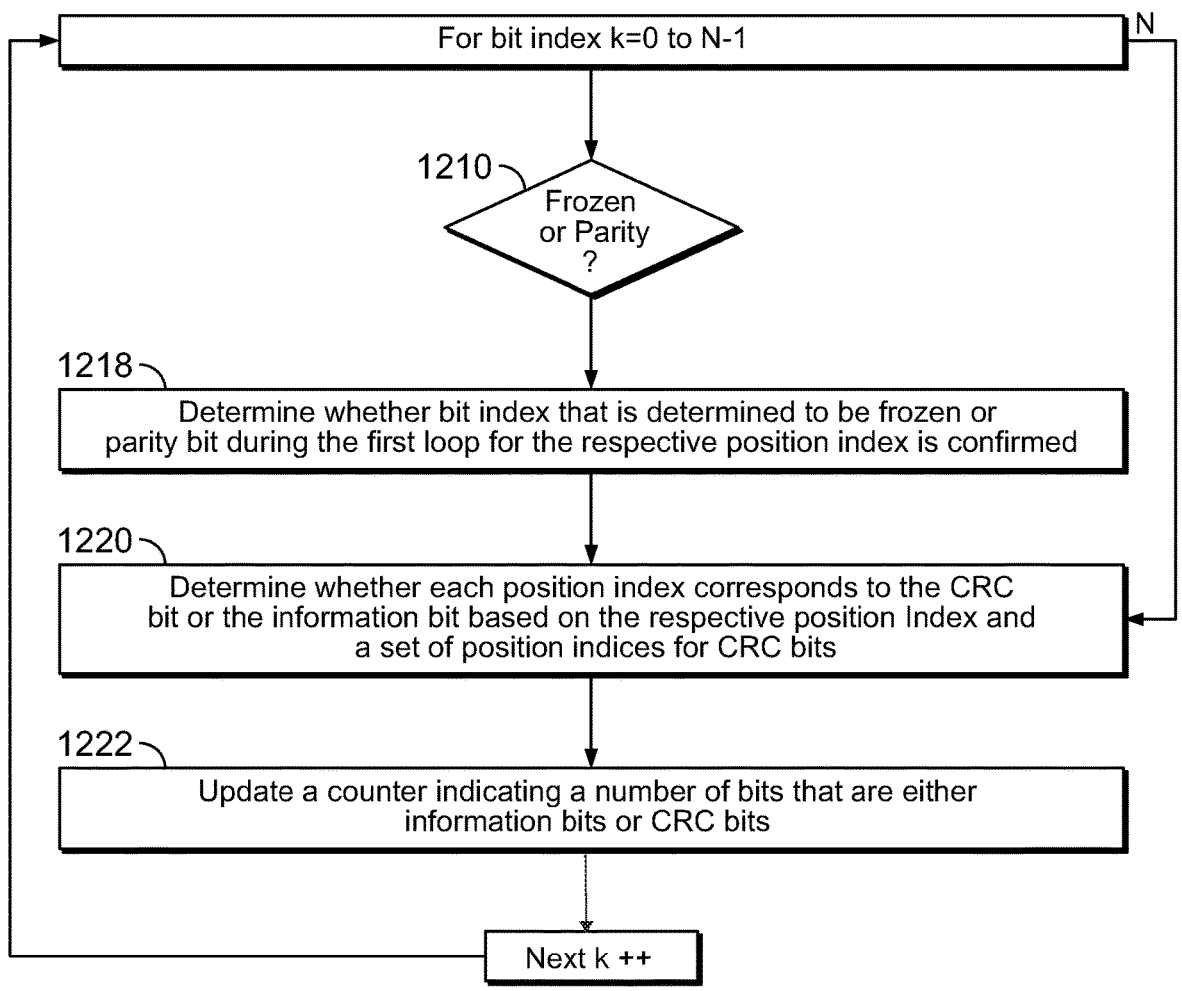
FIG. 12B is a logic flow diagram illustrating the second loop of process in FIG. 11, according to some embodiments described herein.

FIG. 12B is a logic flow diagram illustrating the second loop 1103 of process 1100 in FIG. 11, according to some embodiments described herein. As discussed in relation to FIG. 11, the second loop 1103 iterates the determined bit types in bit index order k=0 to N−1 at the intermediate RAM, which were previously stored at the intermediate RAM during the first loop 1102. For each bit index k, at step 1216, if the bit index k has been determined as a frozen or parity bit, then the respective bit index k is confirmed to be a frozen or parity bit as determined by the first loop 1102, at step 1218.

If the bit index k has not been determined to be a frozen bit, the second loop 1103 proceeds to step 1220, determining whether the position index k corresponds to a CRC bit or an information bit. Specifically, a CRC position lookup table (e.g., 419 in FIG. 4A) can be used to determine whether the current counter m of the number of information or CRC bits encountered so far can be found on the CRC position lookup table, e.g., $m \in C_A^L$. If $m \in C_A^L$, then bit index k is determined to be a CRC bit. Otherwise, the bit index k is determined to be an information bit.

At step 1222, after a CRC bit or an information bit has been determined, the counter m is incremented by 1.

The second loop 1103 then proceeds to the next bit index k and repeats steps 1216-1222.

It is noted that various configurations illustrated in FIGS. 1-7 are exemplary only and not intended to be limiting beyond what is specifically recited in the claims that follow. It will be understood by those skilled in that art that other configurations may be used. One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device. The code segments may be downloaded via computer networks such as the Internet, Intranet, etc.

Additional embodiments include a single-loop Polar code generation using a reliability index lookup table. A method is provided, including receiving a first number of data bits for encoding into a Polar code having a second number of data bits, wherein each data bit from the second number of data bits corresponds to a respective position index in the Polar code; determining, via a pre-computed lookup table, a first reliability index corresponding to a first position index in the Polar code; determining a first bit type for a first data bit corresponding to the first position index as a frozen bit, parity bit, an information bit, or a cyclic redundancy check (CRC) bit based on a relationship of the first reliability index, a size of the Polar code, a number of information bits in the Polar code and a number of CRC bits in the Polar code, and a number of parity bits in the Polar code; and generating the Polar code based at least on the determined first bit type corresponding to the first position index.

In some embodiments, the pre-computed lookup table is selected, from one or more pre-computed lookup tables that are pre-computed and stored for different code sizes, according to a size of the Polar code. The pre-computed lookup table is accessed during a runtime of the method.

In some embodiments, the method further includes determining a respective bit type for each position index in the Polar code based on the relationship of the first reliability index, the size of the Polar code, the number of information bits in the Polar code and the number of CRC bits in the Polar code, and the number of parity bits in the Polar code via a single iteration of all position indices in the pre-computed lookup table.

In some embodiments, determining the first bit type corresponding to the first position index is performed by determining the first bit type as a frozen bit when a first condition is met. The first condition provides that the first reliability index is less than a size of the Polar code minus a sum of a number of information bits in the Polar code, a number of CRC bits in the Polar code, and a number of parity bits in the Polar code.

In some embodiments, when the first condition is not met, the method includes determining the first bit type as a parity bit when a second condition is satisfied. The second condition provides that the first reliability index is less than the size of the Polar code minus a sum of the number of information bits, the number of CRC bits, and a number of pre-defined parity bits.

In some embodiments, when neither the first condition nor the second condition is met, the method includes determining the first bit type as a parity bit when a third condition is met. The third condition provides that the first reliability index belongs to a pre-computed set of indices for the number of pre-defined parity bits.

In some embodiments, when none of the first, the second and the third conditions is met, and the Polar code is non-interleaved, the method further includes determining the first bit type as an information bit when a current count of information bits and CRC bits is less than the number of information bits in the Polar code. The method further includes determining the first bit type as a CRC bit when the current count of information bits or CRC bits is greater than or equal to the number of information bits in the Polar code.

In some embodiments, the method further includes when none of the first, the second and the third conditions is met, and the Polar code is interleaved, determining the first bit type as a CRC bit when a fourth condition is met. The fourth condition provides that the current count of information bits and CRC bits matches a position index for a next CRC bit from a set of interleaved information, or the current count of information bits and CRC bits is greater than the number of information bits plus a parameter. The method further includes determining the first bit type as an information bit when the fourth condition is not met.

In some embodiments, the method further includes creating, at an interleaver, a lookup table having a number of entries no more than a sum of the number of information bits and the number of CRC bits. Each entry from the number of entries indicates whether a respective position index corresponds to a respective bit type of the information bit or the CRC bit. The method further includes accessing the set of interleaved information from the created lookup table.

In some embodiments, the method further includes when neither the first condition nor the second condition is met, determining the first bit type as an information bit when a current count of information bits and CRC bits is less than the number of information bits in the Polar code, determining the first bit type as a CRC bit when the current count of information bits or CRC bits is greater than or equal to the number of information bits in the Polar code; after a respective bit type for each data bit in the Polar code has been determined: for each position index that has been determined as the CRC bit in the Polar code, retroactively changing a respective bit type from the CRC bit to the information bit when a respective reliability index corresponding to the respective position index is less than a sum of the number of information bits and the number of CRC bits in the Polar code, and a current count of information bits and CRC bits is no less than the number of information bits but less than a sum of the number of information bits and the number of pre-defined parity bits; and retroactively determining whether the respective bit type is to be overwritten by the parity bit corresponding to the number of pre-defined parity bit based on a vector of weights for a Polar encoding matrix and a vector of reliability indices.

Additional embodiments further include a memory-based two-loop code generation with rate matching correction. A circuit is provided, including a pre-processor configured to determine, by a first loop of iterating entries in a first pre-computed lookup table, one or more reliability index thresholds for designating frozen bits or parity bits in a Polar code, a memory configured to store the determined one or more reliability index thresholds during the first loop, and a processor configured to determine, by a second loop of iterating entries in a second pre-computed lookup table, a bit type for each position index in the Polar code based at least in part of a respective reliability index corresponding to the respective position index and the determined one or more reliability index thresholds.

In some embodiments, the memory is a first-in-first-out (FIFO) memory that is configured to receive results from the pre-processor including the number of coded bits in the Polar code, the determined one or more reliability index thresholds, and position indices of pre-defined parity bits, and pass the results to the processor.

In some embodiments, the pre-processor comprises a threshold adjustment module that is configured to compute threshold adjustment values to a first reliability index threshold for non-frozen bits and to a second reliability index threshold for parity bits, and position indices of pre-defined parity bits; and a first FIFO interface that is configured to pass the computed threshold adjustment values and the position indices of pre-defined parity bits to the FIFO memory.

In some embodiments, the processor comprises a second FIFO interface configured to receive the computed threshold adjustment values and the position indices of pre-defined parity bits from the FIFO memory. The processor is configured to: read a first reliability index corresponding to a first position index from the first pre-computed lookup table, determine whether the first position index corresponds to a frozen bit by comparing the first reliability index with the first reliability index threshold for non-frozen bits, determine whether the first position index corresponds to a parity bit by at least comparing the first reliability index with the second reliability index threshold for parity bits; and determine whether the first position index corresponds to a CRC bit or an information bit based at least on a CRC lookup table storing interleaved CRC bit indices.

In some embodiments, the memory is a ping-pong memory configured to indicate whether the bit type corresponding to each position index in the Polar code belongs to (1) the frozen bits or the parity bits, or (2) information bits or cyclic redundancy check (CRC) bits.

In some embodiments, the pre-processor includes a comparator configured to compare a current count of bits that are not to be punctured after rate matching with a sum of a number of information bits, a number of CRC bits, and a number of parity bits and generate an indication of a bit type of frozen bits, parity bits, or one of CRC bits and information bits; a flag encoder configured to generate a bit type flag based on the indication of the bit type; and a first random-access memory interface configured to pass the bit type flag to the ping-pong memory.

In some embodiments, the processor comprises: a second random-access memory interface configured to receive the bit type flag indicating the bit type of frozen bits, parity bits, or one of CRC bits and information bits. The processor is configured to: when the bit type flag indicates the bit type as one of CRC bits and information bits, determine whether the bit type corresponds to a CRC bit or an information bit based at least on a CRC lookup table storing interleaved CRC bit indices.

In some embodiments, the pre-processor includes a set of parallel pre-processing units, and a total number of the parallel pre-processing units is no greater than the number of coded bits in the Polar code. Each parallel pre-processing unit is configured to read a reliability index from the first pre-computed lookup table and generate a respective variable based on the reliability index for computing the one or more reliability index thresholds, thereby completing the first loop in one cycle.

In some embodiments, the processor comprises a set of parallel processing units, wherein a total number of the parallel processing units is no greater than the number of coded bits in the Polar code. Each parallel processing unit is configured to read a reliability index from the second pre-computed lookup table and determine a respective bit type for a respective position index corresponding to the reliability index, thereby completing the second loop in one cycle.

In some embodiments, the first pre-computed lookup table stores a first list of position indices in the Polar code based on an order of corresponding reliability indices from high to low, and the second pre-computed lookup table stores a second list of reliability indices based on a bit order of corresponding position indices in the Polar code.

Additional embodiments described herein further includes a FPGA-based two-loop code generation with rate matching correction. A method is provided, including receiving a first number of data bits for encoding into a Polar code having a second number of data bits. Each data bit from the second number of data bits corresponds to a respective position index in the Polar code. The method further includes determining, by a first loop of iterating entries in a first pre-computed lookup table, whether each data bit corresponding to the respective position index is a frozen bit or a parity bit, and determining, by a second loop of iterating bit types determined from the first loop, whether the each data bit corresponding to the respective position index is an information bit, a cyclic redundancy check (CRC) bit or the parity bit.

In some embodiments, the method includes during the first loop, storing a determined bit type corresponding to a processed position index at an intermediate memory; and during the second loop, reading the stored determined bit type in a bit order from the intermediate memory.

In some embodiments, the first pre-computed lookup table stores a first list of position indices in the Polar code based on an order of corresponding reliability indices from high to low.

In some embodiments, the method further comprises: prior to the first loop, computing the second number for the Polar code; and computing a set of position indices that are to be punctured for rate matching and hence to be forced to frozen bits.

In some embodiments, the computing the set of position indices that are to be punctured for rate matching and hence to be forced to frozen bits is performed by computing one or more reliability index thresholds for determining frozen bits.

In some embodiments, the method further includes during the first loop, determining whether each position index corresponds to the frozen bit based at least on the respective position index and the set of position indices that are to be punctured for rate matching and hence to be forced to frozen bits.

In some embodiments, the method further includes during the first loop, updating a counter indicating a number of bits that are not to be punctured after rate matching based at least on a corresponding logarithmic row weight in a Polar encoding matrix retrieved from a second pre-computed lookup table; and storing the updated counter at an intermediate memory at each iteration of the first loop.

In some embodiments, the second pre-computed lookup table stores a second list of logarithmic row weights in a Polar encoding matrix based on the order of corresponding reliability indices from high to low.

In some embodiments, during the second loop, the method includes iterating the stored bit types at the intermediate memory based on a natural order of the bit position indices and determining whether a respective bit type that is determined to be the frozen bit during the first loop for the respective position index is confirmed.

In some embodiments, the method further includes, during the second loop, determining whether each position index corresponds to the CRC bit or the information bit based on the respective position index and a set of position indices for CRC bits, updating a counter indicating a number of bits that are either information bits or CRC bits, and storing the updated counter at an intermediate memory at each iteration of the second loop.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A circuit for Polar code generation, comprising:
   a first memory configured to store a first lookup table including a plurality of position indices in a Polar code and a plurality of corresponding reliability indices respectively; and
   a processor configured to:
      retrieve, for each position index in the Polar code, a respective reliability index from the first lookup table;
      determine a respective bit type from a plurality of predetermined bit types for each data bit of the Polar code corresponding to the respective position index based on the respective reliability index; and
      generate the Polar code based on the determined bit types, wherein the Polar code is used to generate polar encoded data.

2. The circuit of claim 1, wherein the processor is configured to determine the respective bit type from a group of a frozen bit type, a parity bit type, an information bit type, or a cyclic redundancy check (CRC) bit type.

3. The circuit of claim 1, wherein the processor is configured to iterate all position indices of the Polar code listed in the first lookup table in a single loop, and
   wherein for each iteration, the processor is configured to determine the respective bit type for the each data bit of the Polar code based on a relationship between code parameters including any of a first reliability index, a size of the Polar code, a number of information bits in the Polar code and a number of CRC bits in the Polar code, and a number of parity bits in the Polar code.

4. The circuit of claim 1, further comprising:
a pre-processor configured to:
 receive code parameters relating to the Polar code, and
 determine, by iterating entries of the first lookup table in a first loop, one or more reliability index thresholds for determining whether the respective bit type in the Polar code is a frozen bit; and
wherein the processor is further configured to determine, by iterating entries of a second lookup table in a second loop, the respective bit type for the each position index in the Polar code based on the determined one or more reliability index thresholds.

5. The circuit of claim 4, further comprising:
a second memory configured to:
 store the determined one or more reliability index thresholds, and
 send the determined one or more reliability index thresholds to the processor.

6. The circuit of claim 5, wherein the second memory is a first-in-first-out (FIFO) memory, and
wherein the pre-processor comprises:
 a threshold adjustment module that is configured to compute threshold adjustment values to a first reliability index threshold for non-frozen bits and to a second reliability index threshold for parity bits, and position indices of pre-defined parity bits; and
 a first FIFO interface that is configured to pass the computed threshold adjustment values and the position indices of pre-defined parity bits to the FIFO memory.

7. The circuit of claim 5, wherein the second memory is a random-access memory configured to indicate whether the bit type corresponding to each position index in the Polar code belongs to (1) frozen bits or parity bits, or (2) information bits or cyclic redundancy check (CRC) bits, and
 wherein the pre-processor comprises:
  a comparator configured to compare a current count of bits that are not to be punctured or shortened after rate matching with a sum of a number of information bits, a number of CRC bits, and a number of parity bits and generate an indication of a bit type of frozen bits, parity bits, or one of CRC bits and information bits;
  a flag encoder configured to generate a bit type flag based on the indication of the bit type; and
  a first random-access memory interface configured to pass the bit type flag to the random access memory.

8. The circuit of claim 4, wherein the pre-processor includes a set of parallel pre-processing units, and a total number of the parallel pre-processing units is less than or equal to a number of coded bits in the Polar code, and
 each parallel pre-processing unit is configured to read the respective reliability index from the first lookup table and generate a respective variable based on the respective reliability index for computing the one or more reliability index thresholds, thereby completing the first loop in a reduced number of cycles less than the number of coded bits in the Polar code.

9. The circuit of claim 4, wherein the processor comprises:
a set of parallel processing units, wherein a total number of the parallel processing units is no greater than a number of coded bits in the Polar code, and
wherein each parallel processing unit is configured to read the respective reliability index from the second lookup table and determine the respective bit type for the respective position index corresponding to the respective reliability index, thereby completing the second loop in a reduced number of cycles less than the number of coded bits in the Polar code.

10. The circuit of claim 1, wherein the processor is further configured to determine the respective bit type from the plurality of predetermined bit types for each data bit of the Polar code by:
determining, by a first loop of iterating entries in a third lookup table in an order of reliability indices, whether each data bit corresponding to the respective position index is a frozen bit or a parity bit;
storing, at an intermediate memory, during the first loop, determined bit types in an order of the position indices; and
determining, by a second loop of iterating stored determined bit types stored at the intermediate memory in the order of the position indices, whether the each data bit corresponding to the respective position index is an information bit, a CRC bit or a parity bit.

11. A method for Polar code generation, comprising:
retrieving, for each position index in a Polar code, a respective reliability index from a first lookup table stored at a first memory, the first lookup table including a plurality of position indices in the Polar code and a plurality of corresponding reliability indices respectively;
determining a respective bit type from a plurality of predetermined bit types for each data bit of the Polar code corresponding to the respective position index based on the respective reliability index; and
generating the Polar code based on the determined bit types, wherein the Polar code is used to generate polar encoded data.

12. The method of claim 11, further comprising:
determining the respective bit type from a group of a frozen bit type, a parity bit type, an information bit type, or a cyclic redundancy check (CRC) bit type.

13. The method of claim 11, further comprising:
iterating all position indices of the Polar code listed in the first lookup table in a single loop, and
for each iteration, determining the respective bit type for the each data bit of the Polar code based on a relationship between code parameters including any of a first reliability index, a size of the Polar code, a number of information bits in the Polar code and a number of CRC bits in the Polar code, and a number of parity bits in the Polar code.

14. The method of claim 11, further comprising:
receiving, at a pre-processor, code parameters relating to the Polar code, and
determining, at the pre-processor, by iterating entries of the first lookup table in a first loop, one or more reliability index thresholds for determining whether the respective bit type in the Polar code is a frozen bit; and
determining, at a processor, by iterating entries of a second lookup table in a second loop, the respective bit type for the each position index in the Polar code based on the determined one or more reliability index thresholds.

15. The method of claim 14, further comprising:
storing, at a second memory, the determined one or more reliability index thresholds, and sending the determined one or more reliability index thresholds to the processor.

16. The method of claim 15, wherein the second memory is a first-in-first-out (FIFO) memory, and computing, at the pre-processor, threshold adjustment values to a first reliability index threshold for non-frozen bits and to a second reliability index threshold for parity bits, and position indices of pre-defined parity bits; and passing, via a first FIFO interface, the computed threshold adjustment values and the position indices of pre-defined parity bits to the FIFO memory.

17. The method of claim 15, wherein the second memory is a random-access memory configured to indicate whether the bit type corresponding to each position index in the Polar code belongs to (1) frozen bits or parity bits, or (2) information bits or cyclic redundancy check (CRC) bits, and the method further comprises:

comparing, at the pre-processor, a current count of bits that are not to be punctured or shortened after rate matching with a sum of a number of information bits, a number of CRC bits, and a number of parity bits and generate an indication of a bit type of frozen bits, parity bits, or one of CRC bits and information bits;

generating a bit type flag based on the indication of the bit type; and passing, via a first random-access memory interface, the bit type flag to the random-access memory.

18. The method of claim 14, wherein the pre-processor includes a set of parallel pre-processing units, and a total number of the parallel pre-processing units is less than or equal to a number of coded bits in the Polar code, and each parallel pre-processing unit is configured to read the respective reliability index from the first lookup table and generate a respective variable based on the respective reliability index for computing the one or more reliability index thresholds, thereby completing the first loop in a reduced number of cycles less than the number of coded bits in the Polar code.

19. The method of claim 14, wherein the processor comprises:

a set of parallel processing units, wherein a total number of the parallel processing units is no greater than a number of coded bits in the Polar code, and wherein each parallel processing unit is configured to read the respective reliability index from the second lookup table and determine the respective bit type for the respective position index corresponding to the respective reliability index, thereby completing the second loop in a reduced number of cycles less than the number of coded bits in the Polar code.

20. The method of claim 11, wherein the determining the respective bit type from the plurality of predetermined bit types for each data bit of the Polar code comprises:

determining, by a first loop of iterating entries in a third lookup table in an order of reliability indices, whether each data bit corresponding to the respective position index is a frozen bit or a parity bit;

storing, at an intermediate memory, during the first loop, determined bit types in an order of the position indices; and determining, by a second loop of iterating stored determined bit types stored at the intermediate memory in the order of the position indices, whether the each data bit corresponding to the respective position index is an information bit, a CRC bit or a parity bit.

* * * * *

UNITED STATES PATENT AND TRADEMARK OFFICE
CERTIFICATE OF CORRECTION

PATENT NO. : 11,082,067 B1
APPLICATION NO. : 16/592381
DATED : August 3, 2021
INVENTOR(S) : Ming Ruan et al.

It is certified that error appears in the above-identified patent and that said Letters Patent is hereby corrected as shown below:

In the Specification

Column 7, Line 7, Delete "10B" and insert -- IOB --, therefor.

Column 13, Line 60, Delete "$\{k_1, k_n\}$" and insert -- $\{k_1,... k_n\}$ --, therefor.

Column 13, Line 64, Delete "$\{k_1, k_n\}$" and insert -- $\{k_1,... k_n\}$ --, therefor.

Column 17, Line 31, Delete "J(k) E" and insert -- J(k) $\geq$ E --, therefor.

Column 21, Line 24, Delete "$F_E^{A=L}$" and insert -- $F_E^{A+L}$ --, therefor. (First Occurrence)

Column 21, Line 24, Delete "$F_E^{A=L}$" and insert -- $F_E^{A+L}$ --, therefor. (Second Occurrence)

Column 21, Line 31, Delete "$F_E^{A=L}$" and insert -- $F_E^{A+L}$ --, therefor.

Column 21, Line 38, Delete "$F_E^{A=L}$" and insert -- $F_E^{A+L}$ --, therefor.

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*